(12) United States Patent
Best et al.

(10) Patent No.: US 12,207,430 B2
(45) Date of Patent: Jan. 21, 2025

(54) MANAGING UNWANTED HEAT, MECHANICAL STRESSES AND EMI IN ELECTRICAL CONNECTORS AND PRINTED CIRCUIT BOARDS

(71) Applicant: Samtec, Inc., New Albany, IN (US)

(72) Inventors: Burrell G. Best, New Albany, IN (US); Brian R. Vicich, New Albany, IN (US); Kevin R. Meredith, New Albany, IN (US); Chadrick P. Faith, New Albany, IN (US); Istvan Novak, New Albany, IN (US); Jonathan E. Buck, New Albany, IN (US)

(73) Assignee: SAMTEC, INC., New Albany, IN (US)

( * ) Notice: Subject to any disclaimer, the term of this patent is extended or adjusted under 35 U.S.C. 154(b) by 179 days.

(21) Appl. No.: 17/917,659

(22) PCT Filed: Apr. 7, 2021

(86) PCT No.: PCT/US2021/026226
§ 371 (c)(1),
(2) Date: Oct. 7, 2022

(87) PCT Pub. No.: WO2021/207390
PCT Pub. Date: Oct. 14, 2021

(65) Prior Publication Data
US 2023/0156953 A1    May 18, 2023

Related U.S. Application Data

(60) Provisional application No. 63/198,332, filed on Oct. 12, 2020, provisional application No. 63/019,092, (Continued)

(51) Int. Cl.
*H05K 7/14* (2006.01)
*H01F 27/36* (2006.01)
(Continued)

(52) U.S. Cl.
CPC ............ *H05K 7/1461* (2013.01); *H01F 27/36* (2013.01); *H01R 12/721* (2013.01);
(Continued)

(58) Field of Classification Search
CPC ... H05K 7/1461; H05K 1/0209; H05K 9/0018
(Continued)

(56) References Cited

U.S. PATENT DOCUMENTS

| 5,953,815 A | 9/1999 | Kaminski et al. |
| 7,762,857 B2 | 7/2010 | Ngo et al. |

(Continued)

FOREIGN PATENT DOCUMENTS

| CN | 102738650 A | 10/2012 |
| CN | 110120233 A | 8/2019 |

(Continued)

OTHER PUBLICATIONS

Official Communication issued in International Patent Application No. PCT/US2021/026226, mailed on Jul. 23, 2021.
(Continued)

*Primary Examiner* — Hung S. Bui
(74) *Attorney, Agent, or Firm* — Keating & Bennett, LLP

(57) ABSTRACT

A substrate reinforcement or stiffener can be toolless, slide-on, slide-off, and removable. A hold down can carry pre-attached solder balls, solder units, or fusible elements. Fusible elements can be shaped to reduce thermal and mechanical stresses when reflowed onto a substrate. A heat-producing article can include a heat-dissipation material selectively located on, or immediately adjacent to, a heat-producing article. Clips with a plurality of fingers can be added to power conductors. Graphene strips, graphene coatings, or nanomaterials can be applied to electrically non-conductive articles and are able to selectively direct unwanted heat away from the heat-producing article. Elec- (Continued)

tro-magnetic interference can be reduced by selective placement of voids in a shield of an electrical component.

29 Claims, 24 Drawing Sheets

Related U.S. Application Data filed on May 1, 2020, provisional application No. 63/008,311, filed on Apr. 10, 2020, provisional application No. 63/007,168, filed on Apr. 8, 2020, provisional application No. 63/006,960, filed on Apr. 8, 2020.

(51) Int. Cl.
| | | |
|---|---|---|
| *H01R 12/72* | (2011.01) | |
| *H01R 12/73* | (2011.01) | |
| *H05K 1/02* | (2006.01) | |
| *H05K 9/00* | (2006.01) | |

(52) U.S. Cl.
CPC ......... *H01R 12/737* (2013.01); *H05K 1/0209* (2013.01); *H05K 9/0018* (2013.01)

(58) Field of Classification Search
USPC .......................................................... 361/736
See application file for complete search history.

(56) References Cited

U.S. PATENT DOCUMENTS

| | | |
|---|---|---|
| 8,820,616 B2 | 9/2014 | Gruber et al. |
| 9,048,583 B2 | 6/2015 | Johnescu et al. |
| 2007/0259552 A1* | 11/2007 | Peng .................... H01R 12/716 439/326 |
| 2012/0287590 A1* | 11/2012 | Zhang .............. H01R 13/62994 248/225.11 |
| 2014/0009252 A1 | 1/2014 | Samata et al. |
| 2014/0268536 A1* | 9/2014 | Herman ............. H05K 7/20727 29/832 |
| 2019/0246508 A1 | 8/2019 | Oh et al. |

FOREIGN PATENT DOCUMENTS

| | | | | |
|---|---|---|---|---|
| KR | 20-1999-0029976 U | | 7/1999 | |
| KR | 20050120048 A | * | 12/2005 | ............... H05K 7/14 |
| TW | 254509 U | | 8/1995 | |
| TW | 201044717 A | | 12/2010 | |
| TW | I480902 B | | 4/2015 | |

OTHER PUBLICATIONS

Official Communication issued in corresponding Taiwanese Patent Application No. 110112769, mailed on Jul. 15, 2022.
Office Action in TW110112769, mailed Oct. 12, 2023, 21 pages.

\* cited by examiner

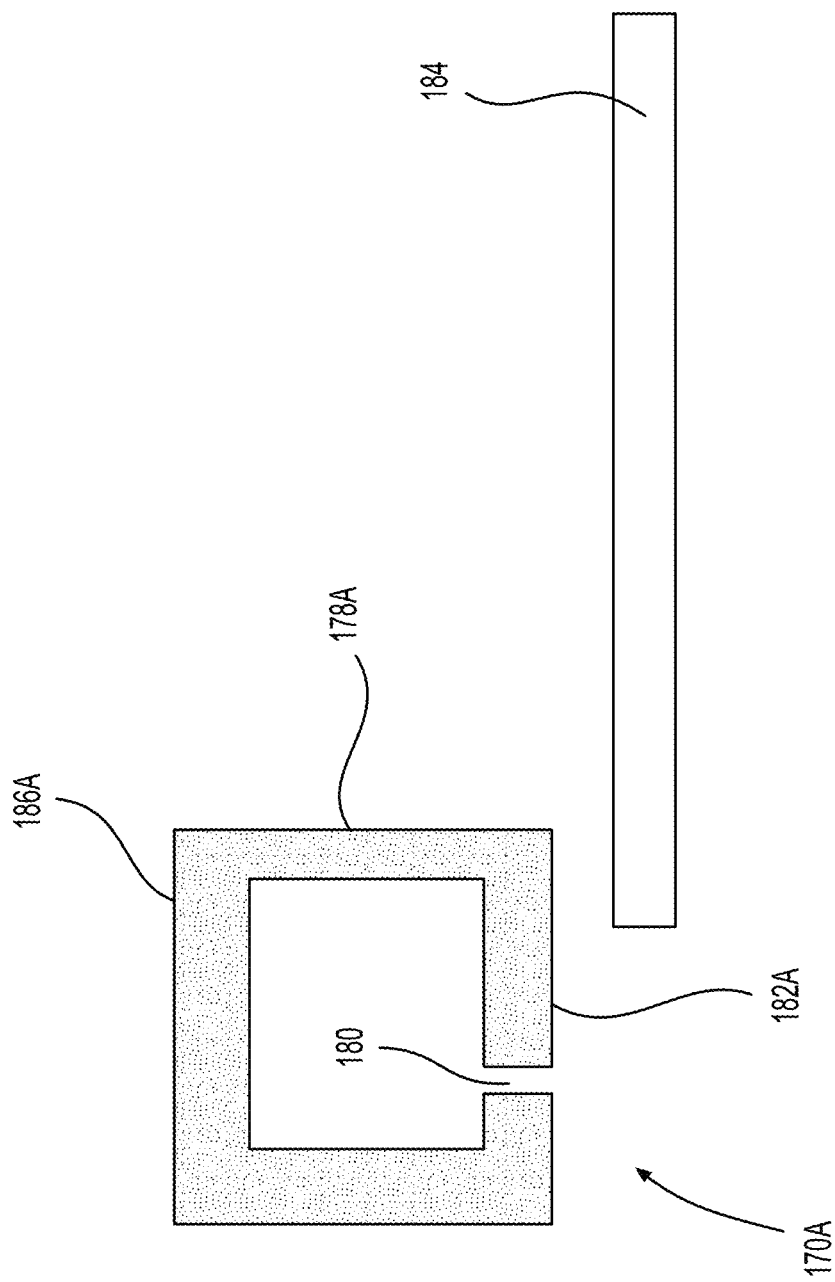

MANAGING UNWANTED HEAT, MECHANICAL STRESSES AND EMI IN ELECTRICAL CONNECTORS AND PRINTED CIRCUIT BOARDS

CROSS REFERENCE TO RELATED APPLICATIONS

This application claims the benefit of U.S. Patent Application No. 63/006,960 filed on Apr. 8, 2020; U.S. Patent Application No. 63/007,168 filed on Apr. 8, 2020; U.S. Patent Application No. 63/008,311 filed on Apr. 10, 2020; U.S. Patent Application No. 63/019,092 filed on May 1, 2020; and U.S. Patent Application No. 63/198,332 filed on Oct. 12, 2020. The entire contents of each application are hereby incorporated by reference.

BACKGROUND

1. Field of the Invention

The present invention relates to improving unwanted mechanical, thermal, and electro-magnetic interference (EMI) issues in electronic systems. Mechanically, both toolless, slide-on substrate stiffeners surface-mount technology (SMT) electronic-component hold downs with pre-attached or pre-formed solder units are provided. Thermally, heat-dissipation material, such as graphene or nanomaterial, can be added to electrically conductive or electrically non-conductive electrical interconnect portions. Clips with two or more points of physical or electrical contact can be attached to power-conductor mating ends with only one point of physical contact, helping to reduce contact resistance. Removal or reduction of unwanted EMI from an inductor is also disclosed.

2. Description of Other Technical Approaches

Mechanical Stress Management

Printed circuit or printed wiring boards (collectively referred to as PCBs) can have unwanted bowing, causing a loss of coplanarity. Bowing can be caused by heat-driven expansion, coefficient of thermal expansion (CTE) mismatches, forces from electrical component fasteners, manufacturing tolerance stack-ups, etc. Board stiffeners are sometimes used to reinforce a PCB and help to maintain planarity of a surface of a PCB.

An electrical component attached to a substrate by SMT can also experience unwanted mechanical stresses, particularly at the solder connection between the electrical component and the PCB. Unwanted stress cracks can appear in reflowed fusible elements, for example, spherical solder balls that are reflowed onto a substrate or to corresponding pads carried by a substrate. This can cause electrical opens, which are also undesirable. To help mitigate these mechanical stresses, electrical connector through hole or wave solder hold downs/board locks can be SMT mounted to the substrate. The solder balls can also form a cross-sectional hourglass shape, after reflow, to help counteract unwanted mechanical stresses.

Heat Management

Unwanted heat can cause mechanical stress from a coefficient of thermal expansion (CTE) mismatch between an electrical component and a substrate to which the electrical component is attached. Unwanted heat can also cause electrical components to fail or can cause the working life of the electrical components to be shortened.

Electrical components that receive or carry current, including, for example, electrical power conductors, mateable electrical connectors, VCELs, optical engines, and transceivers, can produce unwanted heating, including Joule heating, resistive heating, resistance heating, and Ohmic heating. Joule's first law is expressed as $H/t=I^2R$, where H is heat in Joules (J); t is elapsed time in seconds (s); I is current in amperes (A); and R is electrical resistance in ohms ($\Omega$). The higher the current and the resistance, the more unwanted heat that is generated.

Mateable electrical connectors, including, for example, power connectors, can include a housing, for example, an electrically insulative housing, and can include one or more electrically conductive conductors, for example, one or more power conductors. Power connectors are typically rated as a function of temperature rise above ambient temperature, measured in degrees Celsius (° C.) versus amperes (A) applied. Many conventional power connectors are current rated to a 30° C. rise time. For example, when a power connector temperature reaches 30° Celsius, the amount of current passing through the power connector at that time is the power limit of the power connector. Cooling the power connector permits the current rating to increase.

Heat-producing articles have been previously provided with thermal cooling by providing thermally conductive material, such as a graphene layer, substantially uniformly over a surface of the heat-producing articles. However, such implementations significantly increase manufacturing costs. Cooling may also be inefficient because heat is not purposefully directed in a predetermined direction away from the heat-producing articles.

EMI Management

Electronic components and electrical connectors can generate unwanted EMI, which can introduce unwanted signal noise into a system. Inductors, for example, can cause unwanted noise or unwanted crosstalk in neighboring components. As shown in prior art FIGS. 10A-10C, an inductor, coil, choke, or reactor 170 can include an electrically insulated wire wound into a coil 172 around a core. The coil 172 can define a first terminal at a first end of the electrically insulated wire, and a second terminal at a second end of the electrically insulated wire. The first and second terminals can connect to a substrate or another component, and therefore each of the first and second terminals protrude through or are accessible through corresponding holes or apertures in an inductor shield 178. Inductors 170, regardless of shielding, typically only include a first terminal 174 and a second terminal 176. The inductor 170 can include a magnetic core (not shown), for example, an iron or ferrite core, inside the coil 172. The inductor 170 can include a full or partial shield, for example, a magnetic shield, to minimize unwanted EMI if the inductor 170 is implemented as a power choke.

As shown in inductor 170 in FIG. 10C, the inductor shield 178 partially envelops or surrounds the coil (for example, coil 172 shown FIG. 10A) and the core (not shown), and provides two corresponding openings (not shown) for egress of both the first terminal and the second terminal. Opposed airgaps, slits, crevices, recesses, or voids 180 are further defined in a first shield wall 182 and a second shield wall 186, respectively.

SUMMARY OF THE INVENTION

Overview

According to an embodiment of the present invention, an electrical system includes a substrate and a slide-on stiffener that wraps around an edge of the substrate.

The electrical system can further include a first electrical connector positioned on the substrate. The first electrical connector can include an electrically dielectric housing and graphene, nanomaterial, or both graphene and nanomaterial, and the graphene, the nanomaterial, or both the graphene and the nanomaterial can be positioned asymmetrically about each of the X-, Y-, and Z-axes of the electrically dielectric housing, on the slide-on stiffener, or both the electrically dielectric housing and the slide-on stiffener. The first electrical connector can include a hold down, and the hold down can carry fusible elements prior to reflow of the first electrical connector onto the substrate. The first electrical connector can further include a fusible element that defines, prior to reflow onto the substrate, an apex and a nadir; a width of the fusible element at the apex can be narrower than a width of the fusible element at the nadir; and the apex can be positioned closer to the electrically dielectric housing than the nadir. An external shape of the fusible element can be sculpted or shaped with a laser. The first electrical connector can include a power conductor including a removable or non-removable clip positioned on a mating interface or mating surface of the power conductor. The electrical system can further include an inductor positioned on the substrate, wherein the inductor can include only a single slit, crevice, void, recess, or separation in the inductor shield, other than where first and second terminals of the inductor exit the inductor shield.

Mechanical Stress Management

To help control unwanted warping or bowing of a PCB, or to help maintain a coplanar surface of a PCB, slide-on substrate stiffeners are disclosed. The slide-on substrate stiffeners help to prevent or minimize bowing of a substrate that carries an electrical connector, an optical connector, module, coupler, a chip or die, etc.

According to an embodiment of the present invention, a slide-on substrate stiffener includes a first section, a second section that is perpendicular or substantially perpendicular to the first section, and a third section that is parallel or substantially parallel to the first section and is perpendicular or substantially perpendicular to the second section. The second section abuts or is adjacent to a corresponding edge of a first host substrate when the slide-on substrate stiffener is attached to the first host substrate.

The first and the third sections can extend in a same direction with respect to the second section. The slide-on substrate stiffener can further include a fourth section that extends perpendicular or substantially perpendicular to the first section and parallel or substantially parallel to the second section. The slide-on substrate stiffener can further include a fifth section that extends perpendicular or substantially perpendicular to the third section and parallel or substantially parallel to both the second section and the fourth section. The fourth section can be connected to a first end of the first section, and the first section and the second section can be connected at a second end of the first section opposite to the first end of the first section. The fifth section can be connected to a first end of the third section, and the third section and the second section can be connected at a second end of the third section opposite to the first end of the third section.

The first section, the second section, and the third section can each have a first width. The first host substrate can include a first electrical connector, and the first width can be approximately equal to a second width of a housing of the first electrical connector minus board alignment features of the housing of the first electrical connector. When the slide-on substrate stiffener is attached to the first host substrate, the first section can extend over the first electrical connector when viewed in plan and does not physically or electrically touch the first electrical connector.

The slide-on substrate stiffener can further include graphene and/or nanomaterial. In cross-section, the slide-on substrate stiffener can define a U-shape with opposed, parallel flared ends. The first section can define at least one hole, and the at least one hole can receive a fastener. The slide-on substrate stiffener can be toolless and may not include surface-mount technology (SMT), press-fit, or fastener mounts.

According to an embodiment of the present invention, a system includes the slide-on substrate stiffener of one of the various other embodiments of the present invention, the first host substrate, a first electrical connector positioned on the first host substrate, a second host substrate positioned parallel or substantially parallel to the first host substrate, and a second electrical connector positioned on the second host substrate. The first section, the second section, the third section, the fourth section, and the fifth section do not touch the first electrical connector, the second electrical connector, or the second host substrate.

The slide-on substrate stiffener can only physically touch one of the first host substrate or the second host substrate. The slide-on substrate stiffener can be frictionally and removably attached to the first host substrate.

To help prevent unwanted stress of a signal conductor or ground conductor SMT/substrate interface, hold downs, also referred to as board locks, can be configured with preformed solder units or fusible elements, carried by the hold downs prior to reflow, which eliminates the need for wave soldering or other separate soldering of the hold down to the PCB, decreasing processing time and reducing costs.

According to an embodiment of the present invention, a method of manufacturing a surface-mount hold down includes a step of attaching a first fusible element to either the surface-mount hold down or a hold-down base of the surface-mount hold down prior to reflow of the surface-mount hold down onto a first host substrate.

The method can further include a step of sizing individual fusible elements to increase a solder mass carried by either the surface-mount hold down or the hold down base of the surface-mount hold down. The method can further include a step of attaching second fusible elements to the surface-mount hold down or the hold down base of the surface-mount hold down. The method can further include a step of positioning the fusible element and the second fusible elements on the surface-mount hold down or the hold down base of the surface-mount hold down to increase a solder mass carried by the surface-mount hold down or the hold down base of the surface-mount hold down.

Some unique solder unit or fusible element cross-sectional shapes are also disclosed. These shapes help to reduce internal and external mechanical stresses on solder units or fusible elements reflowed onto a substrate.

According to an embodiment of the present invention, an electrical connector includes a housing, at least one electrical conductor, and a hold down that carries at least one first pre-formed fusible element.

The electrical connector can further include at least one second pre-formed fusible element physically connected to a mounting end of the at least one electrical conductor. When the electrical connectors is attached to a substrate, the at least one first pre-formed fusible element and the at least one second pre-formed fusible element can be configured to be reflowed onto the substrate during a same or a single reflow operation.

The at least one second pre-formed fusible element can define a cross-sectional shape selected from the group including: a cone, a triangle, an equilateral triangle, an isosceles triangle, an obtuse triangle, an acute triangle, a trapezoid, an acute trapezoid, an irregular quadrilateral, a concave hexagon that includes at least one reflex angle greater than 180°, an irregular hexagon that includes sides that are not equal in length and that includes one side that forms two intersecting line segments, a pentagon, a heptagon, an irregular octagon, a triangular prism, a triangular-based pyramid, tetrahedron, a square-based pyramid, a hexagonal pyramid shape, and a shape similar to the "OR" logic symbol.

A mounting end of the at least one electrical conductor can penetrate an apex of the at least one second pre-formed fusible element.

According to an embodiment of the present invention, a method of making a stronger solder connection includes reflowing or fusing a fusible element onto a respective mounting end of an electrical conductor, wherein the fusible element has a first external or cross-sectional shape; and subsequently sculpting the fusible element to form a second external or cross-sectional shape that is different than the first external or cross-sectional shape.

The method can further include a step of adding a non-wetting additive to the fusible element before or after the fusible element is sculpted.

Accordingly, cracking and shearing of reflowed fusible elements can be substantially eliminated by forming or placing, in cross-section, non-spherical fusible elements, solder slugs, solder charges, and the like, onto respective mounting ends of respective electrical conductors.

Heat Management

According to a preferred embodiment of the present invention, a heat-producing article includes a heat-dissipation material only selectively located on, or immediately adjacent to, the heat-producing article.

The heat-producing article can further include an electrically dielectric housing, wherein the heat-dissipation material can be graphene or nanomaterial, and the graphene or the nanomaterial can be positioned asymmetrically about X-, Y-, and Z-axes of the electrically dielectric housing.

The heat-dissipation material can be located at right angles with respect to other heat-dissipation material carried by the heat-producing article.

The heat-producing article can an electrical or optical interconnect, and the heat-dissipation material can be positioned on a plastic or electrically non-conductive housing of the electrical or optical interconnect.

Accordingly, the substrate or PCB, interconnects, etc. can operate at lower temperatures, which increases system efficiency and provides a longer useful life of the electrical system and its components.

According to an embodiment of the present invention, a heat-producing article includes a heat-dissipation material positioned on a plastic or electrically non-conductive portion of the heat-producing article.

According to an embodiment of the present invention, an electrical connector includes a housing and an electrical conductor carried by the housing.

The electrical connector can further including graphene or nanomaterial positioned on one or both of the housing and the electrical conductor. The electrical connector can further include a clip positioned on a mating end of the electrical conductor, wherein the clip can include more mating points of electrical contact than the mating end of the electrical conductor. The electrical connector can further include a fusible element positioned on a mounting end of the electrical conductor, wherein the fusible element can include an apex and a nadir, a width of the fusible element at the apex can be narrower than a width of the fusible element at the nadir, and the apex can be positioned closer to the housing than the nadir.

The removable clip can define or have more mating points of electrical contact than the mating end of the electrical conductor. More mating points of electrical contact can reduce contact resistance which, in turn, can lower the generation of unwanted Joule heating.

EMI Management

To help reduce unwanted EMI emissions from an electrical connector, or an electrical component such as an inductor, an inductor according to an embodiment of the present invention can include an inductor shield, a wound coil or a coil that has windings, a first coil end and a second coil end. The inductor shield can have at least one void or only a single void not occupied by the first coil end or the second coil end. The at least one void can be positioned, in its entirety, only beneath the windings of the coil. That is, the inductor shield can have a first inductor shield wall spaced from the coil, and a second inductor shield wall spaced from the coil and oriented parallel or substantially parallel within manufacturing tolerances to the first inductor shield wall. The second inductor shield wall can be spaced farther from the first coil end and the second coil end than the first inductor shield wall, and the at least one void can be defined by, or at least partially by, the first inductor shield wall.

According to an embodiment of the present invention, an inductor includes a coil including windings with a first terminal and a second terminal at opposite ends of the windings and an inductor shield. The inductor shield includes at least one void not occupied by the first terminal or the second terminal, and the at least one void is positioned only beneath all of the windings of the coil.

The above and other features, elements, characteristics, steps, and advantages of the present invention will become more apparent from the following detailed description of the embodiments of the present invention with reference to the attached drawings.

BRIEF DESCRIPTION OF THE DRAWINGS

FIG. 10D is a schematic side view of an improved inductor.

DETAILED DESCRIPTION

Mechanical Stress Management

Figure 1A:
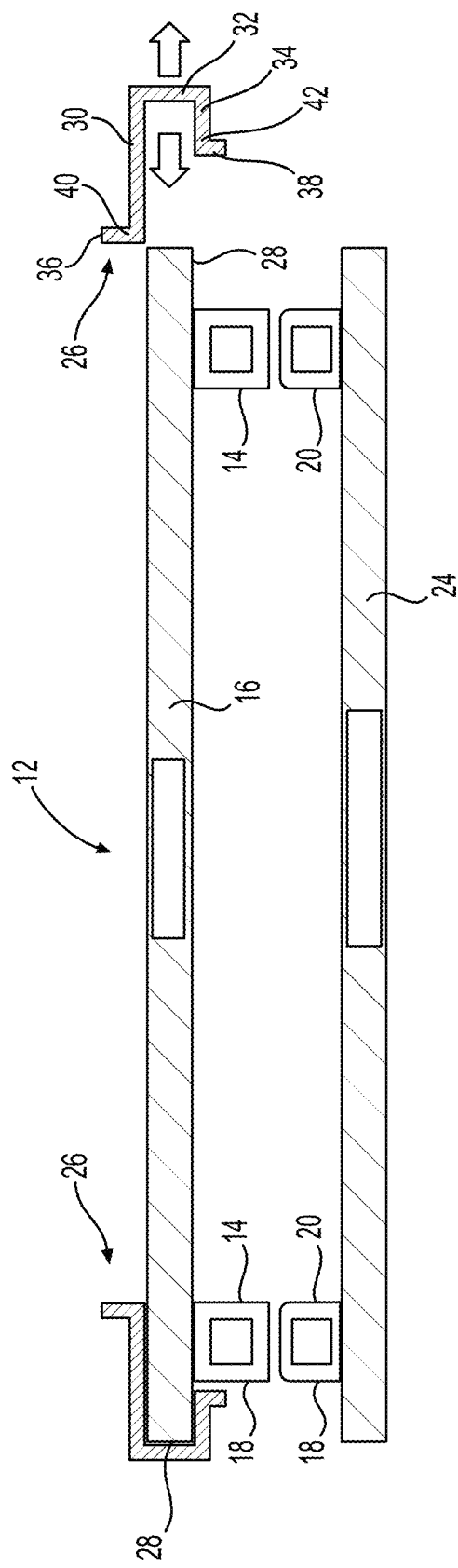
FIG. 1A is side view of a system that has mating mezzanine electrical connectors, parallel first and second host substrates, and a pair of slide-on substrate stiffeners.

To help control unwanted substrate warpage or bowing, slide-on/slide-off substrate stiffeners for substrates, such as PCBs, are described below. FIG. 1A shows a system 12, that can include a first electrical connector or connectors 14 mounted to a first host substrate 16, which can be any suitable substrate, including, for example, a computer processing unit (CPU) substrate, a computer processing module (CPM) substrate, or PCB. The first electrical connector 14 can be one half of mateable mezzanine connectors 18. The other half of the mateable mezzanine connectors 18 can be a respective second electrical connector 20. The second electrical connector 20 can be mounted to a second host substrate 24, which can be any suitable substrate, including, for example, a carrier board or PCB. A first electrical connector 14 can mate with a respective one of the second electrical connectors 20. The first host substrate 16 and the second host substrate 24 can be spaced apart by optional standoffs that can each include a respective standoff screw, for example standoff screw 22 in FIG. 1E. Slide-on/slide-off substrate stiffeners or slide-on only substrate stiffeners 26, which are collectively referred to as slide-on substrate stiffeners 26, can be configured to be slid over and wrap around a corresponding leading edge 28 of the first host substrate 16 or the second host substrate 24.

A system 12 can include the first electrical connector 14 mounted to the first host substrate 16 and a slide-on substrate stiffener 26 removably attached to the first host substrate 16. The slide-on substrate stiffener 26 can only physically contact the first host substrate 16 and not the second host substrate 24, and can be configured to slide over and wrap around the corresponding leading edge 28 of the first host substrate 16.

The first and second electrical connectors 14, 20 or the mateable mezzanine connectors 18 can be any separable mezzanine connectors, such as APM6/APF6, ADM6/ADF6, and COM HPC-compliant connectors manufactured and sold by Samtec, Inc., New Albany, IN The first and second electrical connectors 14, 20 can also be an LGA/BGA or double-sided LGA compression connector, such as ZRAY connectors, manufactured and sold by Samtec, Inc., New Albany, IN Each of the first and second electrical connectors 14, 20, and any electrical connector described herein, can include any one or more of signal conductors, ground conductors, differential signal pairs, conductors arranged in a S-G-S-G, S-S-G-G, or S-S-G-S-S pattern, interleaved crosstalk shields, external EMI shields, latching, magnetic absorbing material, solder balls, compression mounts, press-fit pins, and hold downs or board locks.

Each slide-on substrate stiffener 26 can include a first panel or first section 30, a second panel or second section 32 that can be perpendicular, substantially perpendicular within manufacturing tolerances, or at an angle between about 40° to about 90° to the first section 30 in an un-installed state, and a third panel or third section 34 that can be parallel or substantially parallel within manufacturing tolerances to the first section 30. The third section 34 can be perpendicular, substantially perpendicular within manufacturing tolerances, or at an angle between about 40° to about 90°, with respect to the second section 32, in an un-installed state. The third section 34 can extend substantially in the same direction, with respect to the second section 32, as the first section 30. A fourth ridge or fourth section 36 can extend perpendicular, substantially perpendicular within manufacturing tolerances, or at a non-zero angle with respect to the first section 30 and can extend parallel or substantially parallel within manufacturing tolerances to the second section 32. A fifth ridge or fifth section 38 can extend perpendicular or substantially perpendicular within manufacturing tolerances to the third section 34, and parallel or substantially parallel within manufacturing tolerances to both the second section 32 and the fourth section 36. The fourth section 36 can be positioned at a first end 40 of the first section 30, opposite an intersection of the first section 30 and the second section 32 at a second end of the first section 30 where the first section 30 and the second section 32 are connected. The fifth section 38 can be positioned at a first end 42 of the third section 34, opposite an intersection of the third section 34 and the second section 32 at second end of the third section 34 where the third section 34 and the second section 32 are connected. In cross-section, in an installed or uninstalled state the slide-on substrate stiffener 26 can define a U-shape, with opposed, diverging ends. However, the slide-on substrate stiffener 26 can also define other cross-sectional shapes when installed or un-installed, including for example, a C-shape, a closed C-shape, or a triangular shape. Any one, at least one, at least two, or at least three of the first section 30, the second section 32, and the third section 34 can define at least one curved section in an installed or un-installed state.

The slide-on substrate stiffener 26, such as the type-A slide-on stiffener 50 of FIGS. 1J-1M and the type-B slide-on stiffener 52 of FIGS. 1N-1R can be toolless, that is, the slide-on substrate stiffener 26 can be devoid of SMT mounts, press-fit mounts, and fastener receiving openings. The slide-on stiffener 26 can be retained on a substrate by friction or compression without compression fasteners. Any slide-on substrate stiffener 26 disclosed herein can include an electrically conductive material, an electrically non-conductive material (for example, plastic), a magnetic absorbing material, a thermally conductive material, or any combination of suitable materials. Any slide-on substrate stiffener 26 disclosed herein can include an elastomeric material. Any slide-on substrate stiffener 26 disclosed herein can frictionally and removably adhere to a respective first host substrate 16 or a respective second host substrate 24. Alternatively, a shim (not shown) can be slid under the first section 30 and/or the third section 34, and a substrate stiffener 26 disclosed herein can be held frictionally in place via a normal force exerted against the shim and the slide-on substrate stiffener 26.

Figure 1B:
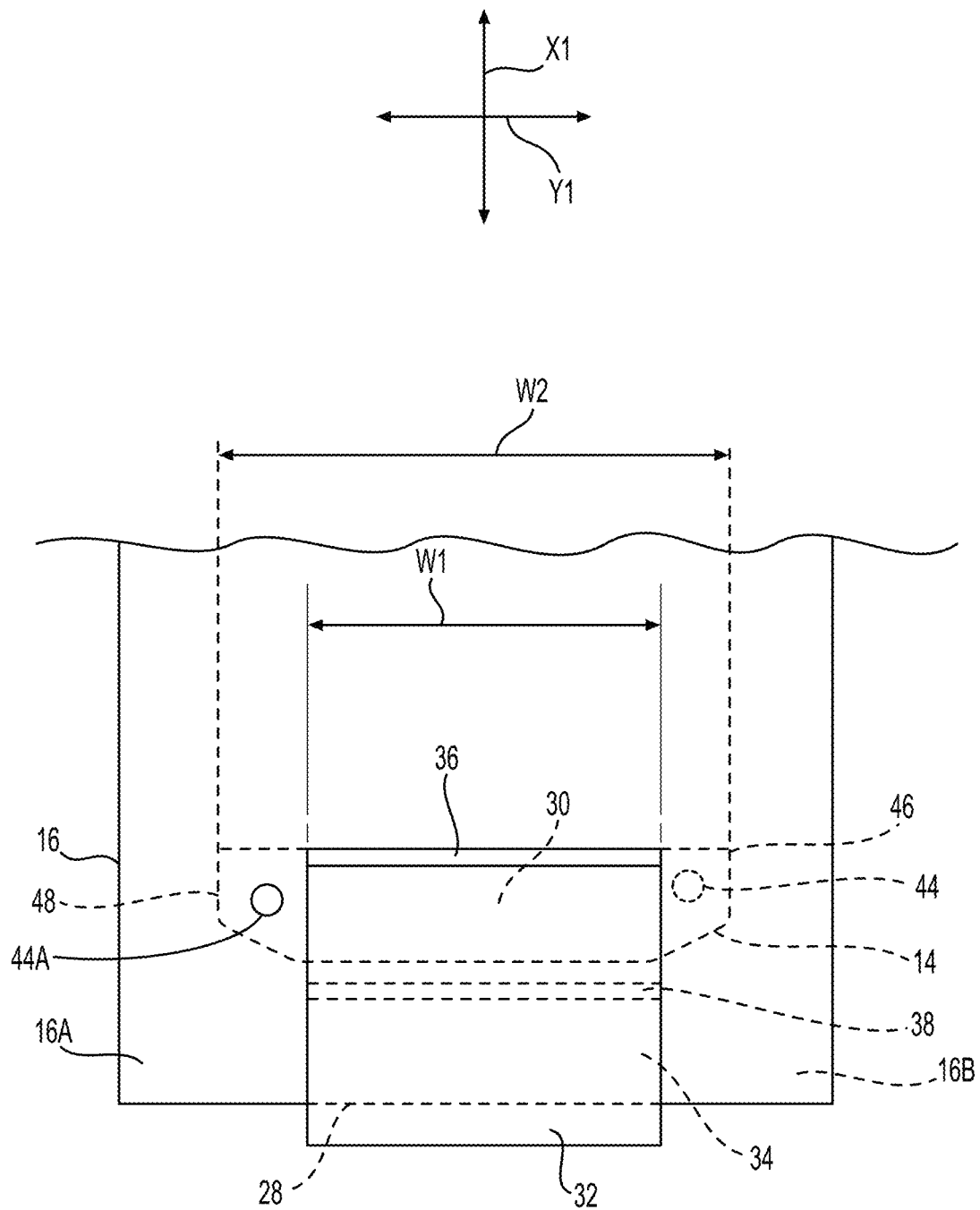
FIG. 1B is a top view of one end of the first host substrate of FIG. 1A.

As shown in FIG. 1B, at least one or at least two of the first section 30, the second section 32, and the third section 34 can have a first width W1 approximately equal to a second width W2 of a corresponding first housing 46 of a first electrical connector 14 or a second housing of a second electrical connector 20; the first width W1 of the slide-on substrate stiffener 26 can be less than a second width W2 of a corresponding first housing 46 of a first electrical connector 14 or a second housing of a second electrical connector 20; a first width W1 of the slide-on substrate stiffener 26 can be greater than a second width W2 of a corresponding first housing 46 of a first electrical connector 14 or a second housing of a second electrical connector 20; or the first width W1 of the first section 30 can be approximately equal to the second width W2 of a corresponding first housing 46 of the first electrical connector 14, minus board alignment features 44 of the first housing 46 of the first electrical connector 14. First width W1 of any one of the first, second, or third sections 30, 32, 34 of the slide-on substrate stiffener 26 can also be equal or approximately equal in numerical measurement value to second width W2. The first section 30 and the second section 32 can extend beyond the corresponding first housing 46 in the X1-direction. Any one, at least two, or all of the first section 30, the second section 32, and the third section 34 can extend over a boundary 48 of the board alignment features 44 or the corresponding first housing 46 or can be coincident with the boundary 48 in the Y1-direction.

If standoffs having standoff screws 22 (FIG. 1D) are not desired due to complexity, cost, space limitations, etc., the first section 30 of a slide-on substrate stiffener 26 can snap over, circumscribe, or physically touch or snap over one or more protruding board alignment features 44A of the first electrical connector 14 that extends or extend entirely through and protrude beyond a first surface 16A of the first host substrate 16, opposite to a second surface 16B to which the first electrical connector 14 is attached. The protruding board alignment feature 44A can act like a non-permanent retention pin or post that permits the first section 30 of the slide-on substrate stiffener 26 to be removably secured to the first host substrate 16. Stated another way, the first section 30 can define at least one hole or recess (54, FIG. 1F) that receives, or at least two holes or recesses that each receive, a corresponding protruding board alignment feature 44A.

Figure 1C:
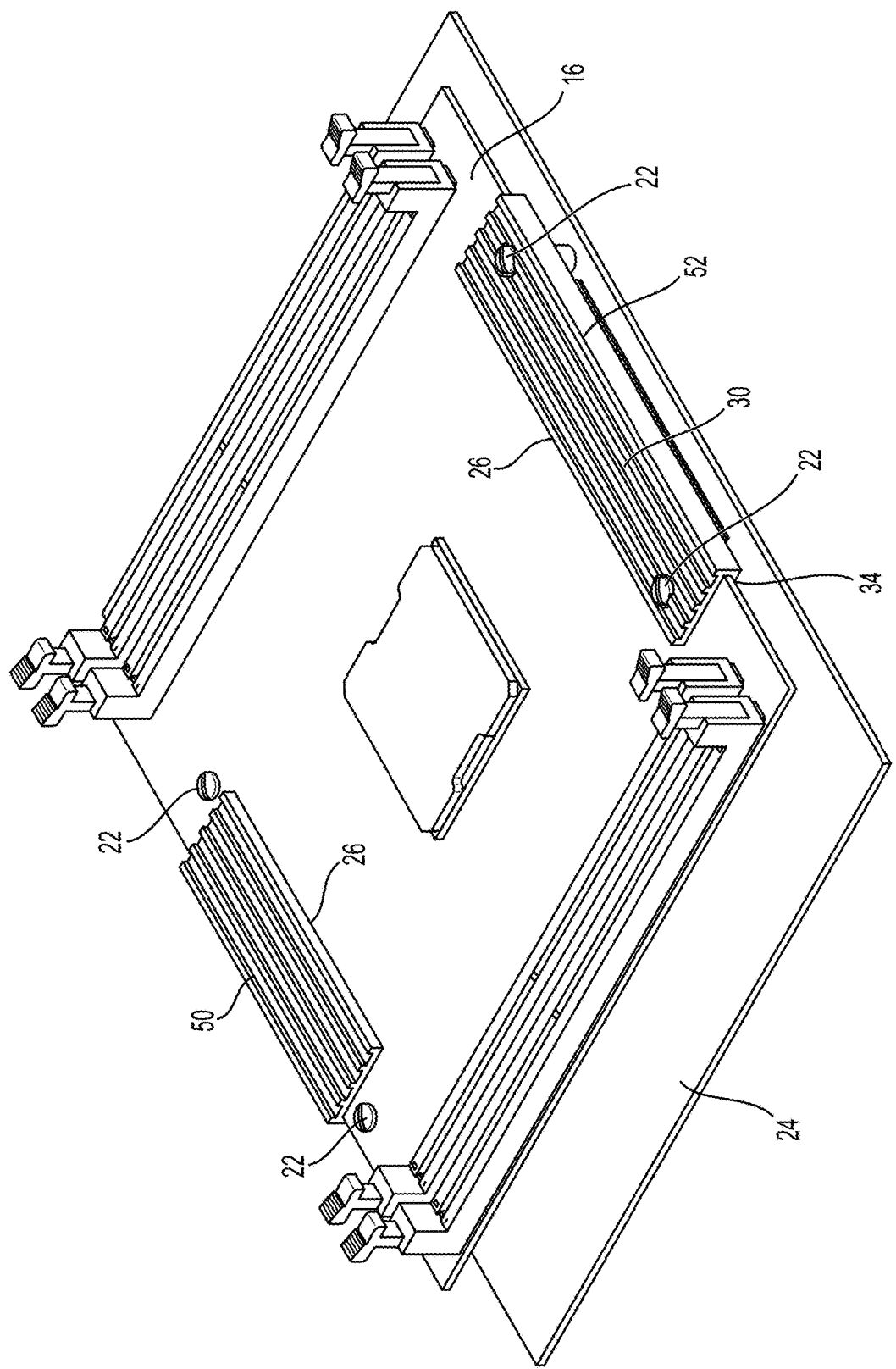
FIG. 1C is a perspective view of the system of FIG. 1A.

In another embodiment, the first section 30 can receive or releasably attach to at least respective portions of, or respective ends of a first standoff screw 22 (FIG. 1C) or other externally threaded or non-threaded fastener that passes through the first host substrate 16 and into a corresponding standoff. A second standoff screw 22 (FIG. 1C) can pass through the second host substrate 24 (FIG. 1A) an into the same corresponding standoff as the first standoff screw 22 (FIG. 1C). The first standoff screws 22 (FIG. 1C) can each protrude beyond the first surface 16A of first host substrate 16. In this embodiment, the standoff screws 22 (FIG. 1C) can collectively secure the first and second host substrates 16, 24 together, via a common standoff, and then the slide-on substrate stiffener 26 can be frictionally or compressibly attached to the first host substrate 16. Alternatively, a standoff with a single standoff screw 22 (FIG. 1C) is disclosed in U.S. Pat. No. 9,374,900, which is hereby incorporated by reference in its entirety.

With reference again to FIG. 1B, the first section 30 can extend over the first electrical connector 14, but may be provided to not physically or electrically touch a respective one of the first electrical connector 14 or the second electrical connector 20 or a respective first housing 46 of the first electrical connector 14 or a second housing of the second electrical connector 20. The second section 32 can abut or be positioned to extend perpendicular or substantially perpendicular within manufacturing tolerances to the leading edge 28 of the first host substrate 16 or the second host substrate 24. In one embodiment, the first section 30, the second section 32, the third section 34, the fourth section 36, and the fifth section 38 do not touch the first electrical connector 14, the second electrical connector 20, or the second host substrate 24. In another embodiment, the first section 30, the second section 32, the third section 34, the fourth section 36, and the fifth section 38 do not touch the first electrical connector 14, the second electrical connector 20, or the first host substrate 16. In general, the slide-on substrate stiffener 26 can be provided to only physically touch the first host substrate 16, only physically touch the second host substrate 24, only physically touch the first substrate 16 and a standoff screw 22 (FIG. 1C), or only physically touch the second host substrate 24 and a standoff screw 22 (FIG. 1C). The slide-on substrate stiffener 26 can also be provided to only physically touch one of the first host substrate 16 or the second host substrate 24. The slide-on substrate stiffener 26 can also be provided to only physically touch two opposed surfaces of the first host substrate 16 or the two opposed surfaces of the second host substrate 24.

Figure 1D:
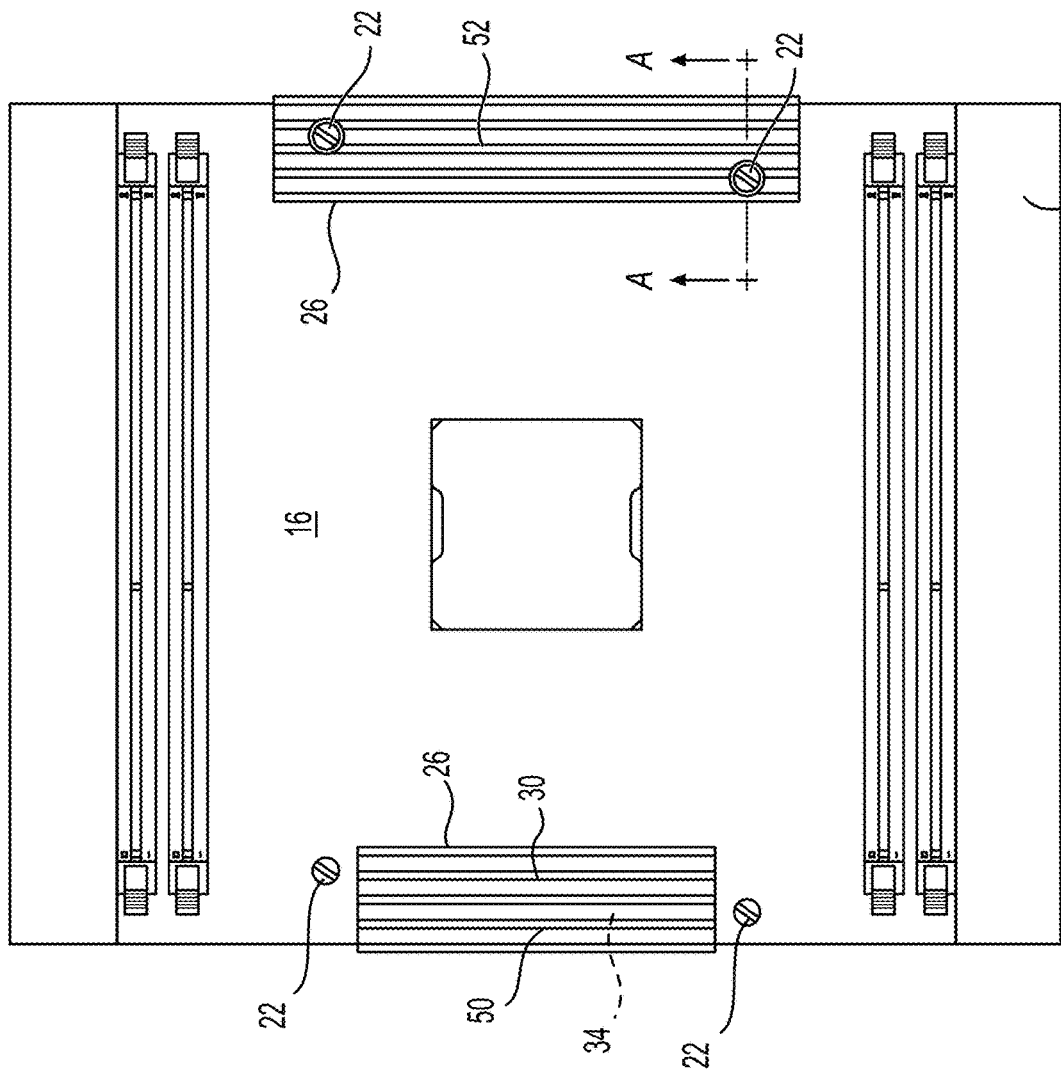
FIG. 1D is a top view of the system of FIG. 1C.

FIGS. 1C and 1D show slide-on substrate stiffeners 26, such as a type-A slide-on substrate stiffener 50 and a type-B slide-on substrate stiffener 52. Either type of slide on substrate stiffener 50, 52, or both, can be attached to the first host substrate 16 and the second host substrate 24. The first host substrate 16 can be spaced from the second host substrate 24. The type-A slide-on substrate stiffener 50 and the type-B slide-on substrate stiffener 52 can be held in place by friction or by standoff screws 22.

Figure 1E:
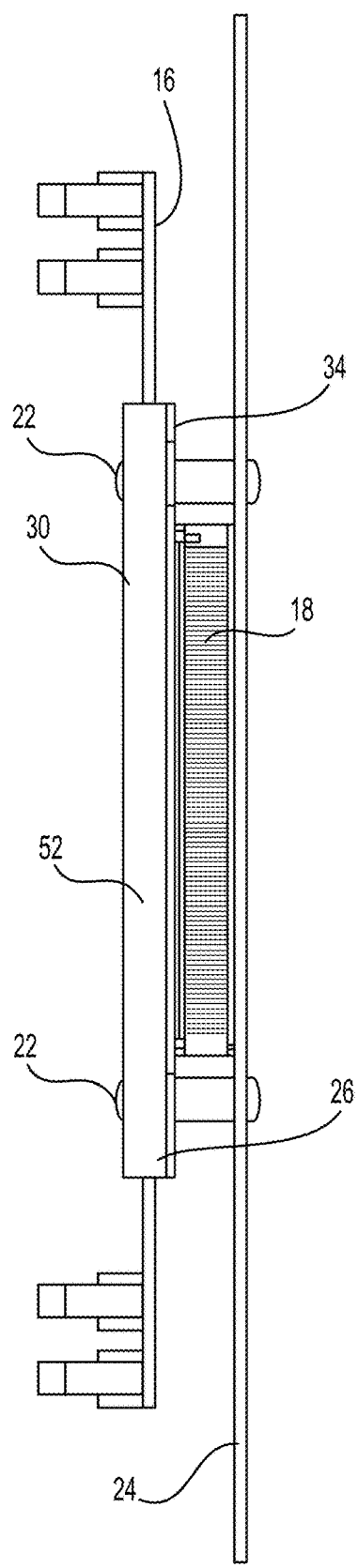
FIG. 1E is a side view of the system of FIG. 1C.

Slide-on substrate stiffener 26, such as type-B slide-on substrate stiffener 52, is further shown in FIG. 1E. At least one of the mateable mezzanine connectors 18, at least one of the standoff screws 22, and at least one slide-on substrate stiffener 26 can each be carried by first host substrate 16. The first host substrate 16 and the second host substrate 24 can each carry one or more of the standoff screws 22. The mateable mezzanine connectors 18 can both be positioned between the first and second host substrates 16, 24. Standoffs can both be positioned between the first and second host substrates 16, 24. First host substrate 16 can be positioned between a first section 30 and a third section 34 of the slide-on substrate stiffener 26. Second host substrate 24 can be positioned between the first section 30 and the third section 34 of the slide-on substrate stiffener 26.

Figure 1F:
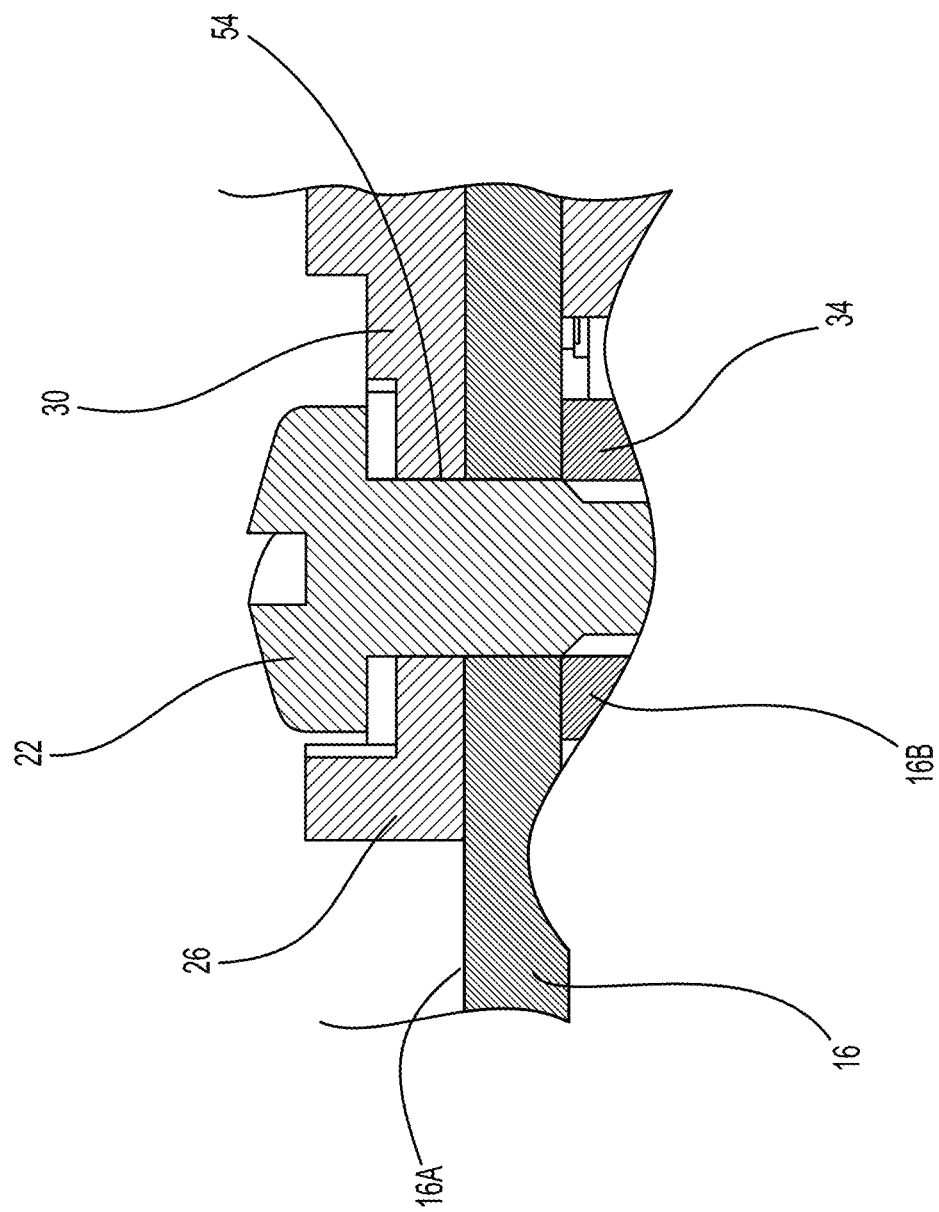
FIG. 1F is a partial sectional view along lines A-A in FIG. 1D.

Turning to FIG. 1F, the first section 30 of the slide-on substrate stiffener 26 can define a first opening, orifice, recess, or hole 54. The third section 34 of the slide-on substrate stiffener 26 can define a second hole 54A coincident with the first hole 54A. A respective standoff screw 22 can extend through both the first hole 54 and the second hole 54A. Even if the respective standoff screw 22 is removed from the corresponding first and second holes 54, 54A, the slide-on substrate stiffener 26 can still stiffen the respective first host substrate 16 or the second host substrate 24. That is, as discussed above, the slide-on substrate stiffener 26 can maintain a friction or elastic compression fit with a substrate, even if the respective standoff screw 22 is removed from the slide-on substrate stiffener 26 and a respective one of the first host substrate 16 or second host substrate 24. Accordingly, the slide-on substrate stiffener 26 can produce a normal force on a respective first or second host substrate 16, 24 by itself, without other external attachments for example, fasteners, epoxies, glues, and welds. The normal force can be exerted onto a first surface 16A or a second surface 16B of a first host substrate 16, or some structure such as a wedge or shim carried by the first host substrate 16 or the second host substrate 24, creating a friction force. The slide-on substrate stiffener 26 can therefore remain attached to a respective first host substrate 16 or a second host substrate 24, even if all other external attachments, for example, fasteners, epoxies, glues, and welds connecting the slide-on substrate stiffener 26 to a respective first host substrate 16 or second host substrate 24 are all completely removed. Alternatively, the slide-on/slide-off substrate stiffener can be slid onto a respective first host substrate 16 or second host substrate 24 and then be permanently attached to the first host substrate 16 or the second host substrate 24 by glue, epoxy, weld, and the like.

Figure 1G:
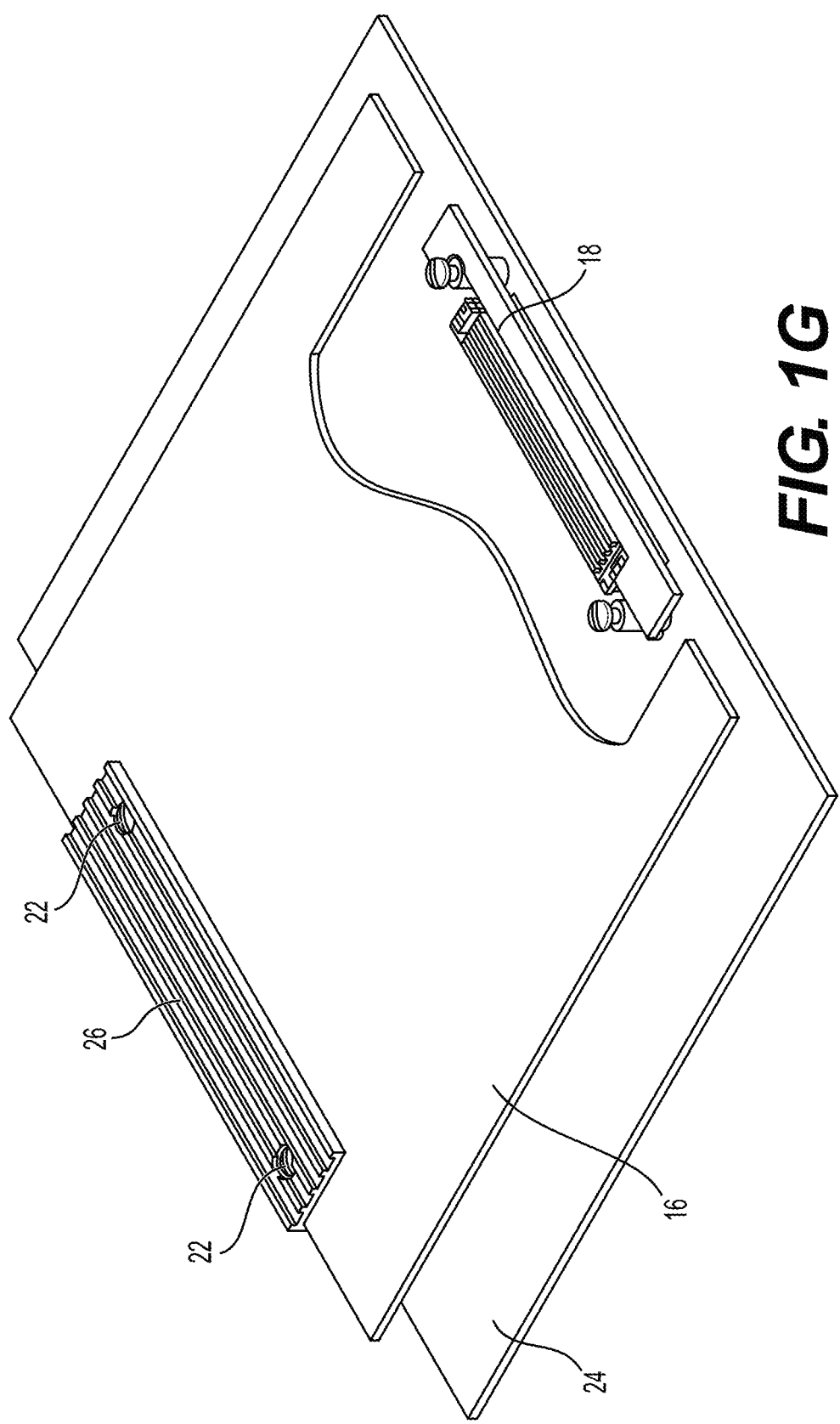
FIG. 1G is a partial cutaway view of the system of FIG. 1C.
Figure 1I:
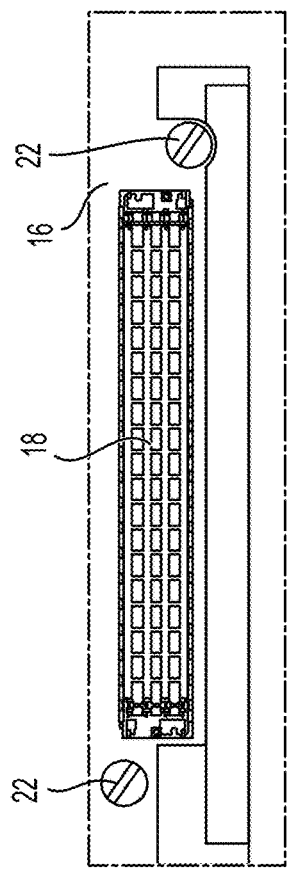
FIG. 1I is a close-up partial view of the system of FIG. 1H.
Figure 1H:
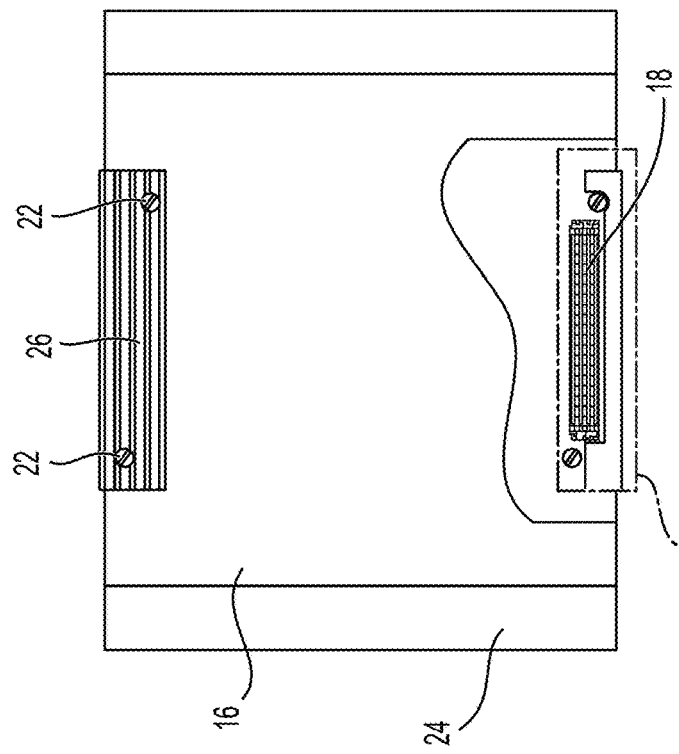
FIG. 1H is a top view of the system of FIG. 1G.
Figure 1K:
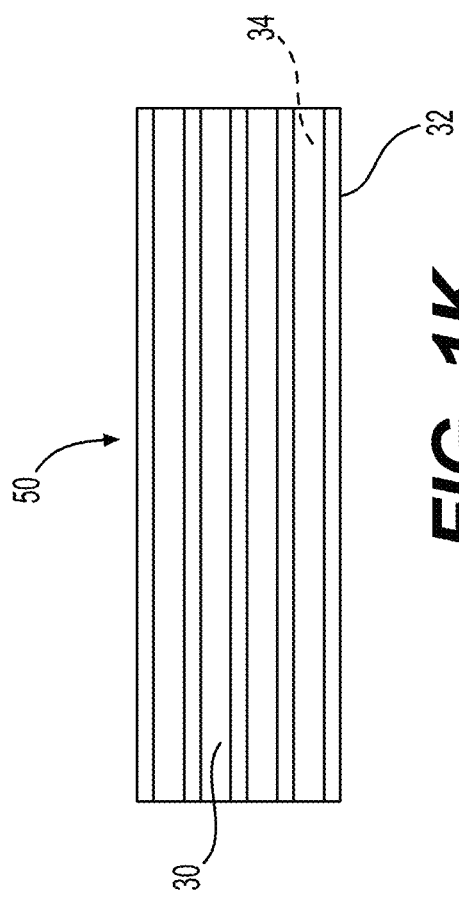
FIGS. 1J-1M are perspective, top, side, and cross-sectional views, respectively, of a type-A, slide-on substrate stiffener.
Figure 1M:
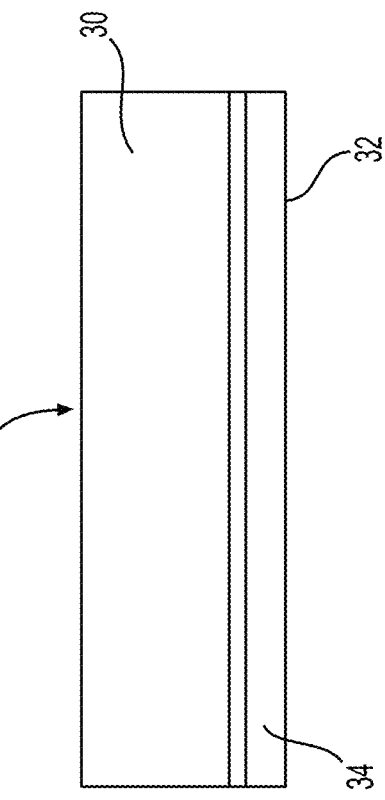
Figure 1J:
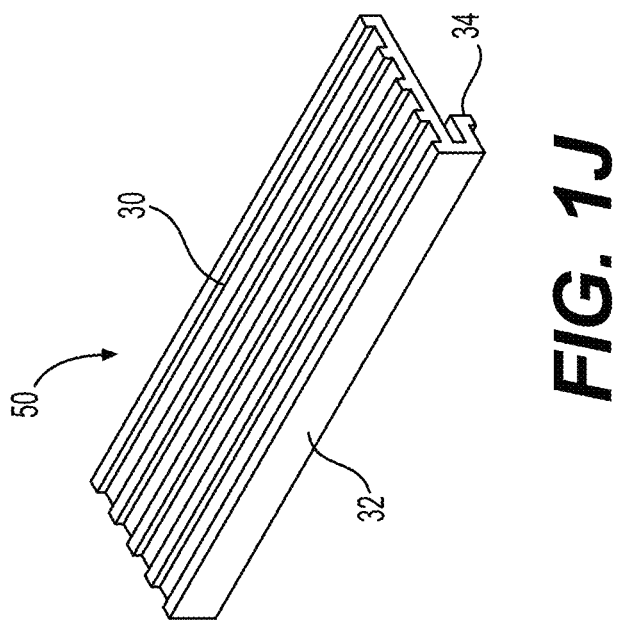
Figure 1L:
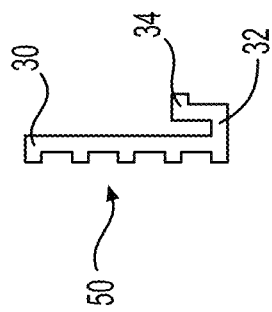
Figure 1O:
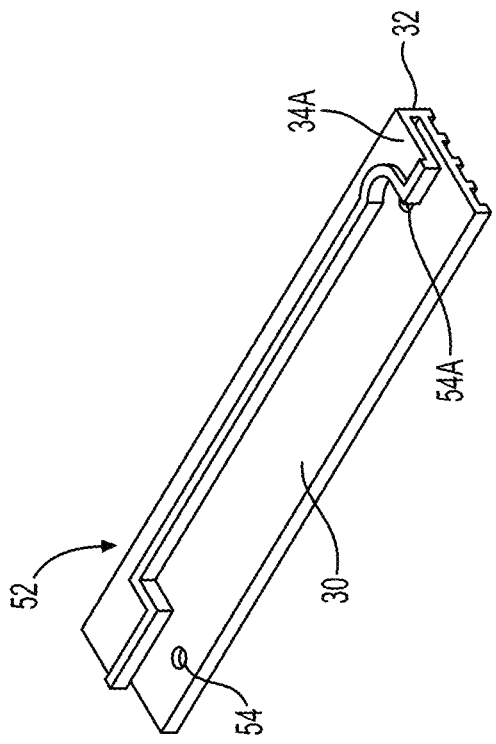
FIGS. 1N-1R are top perspective, bottom perspective, bottom and top views, respectively, of a type-B, slide-on substrate stiffener.
Figure 1N:
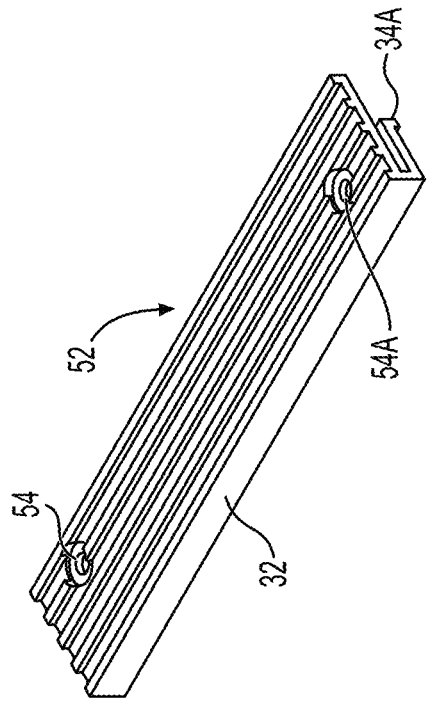
Figure 1R:
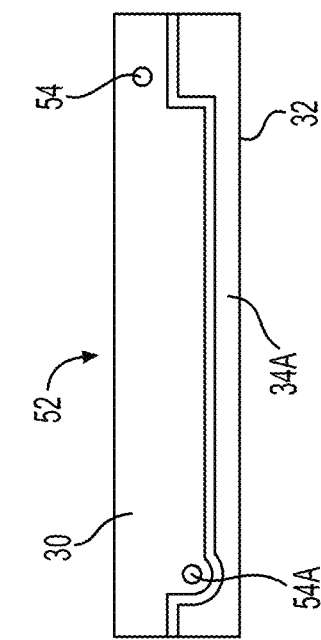
Figure 1Q:
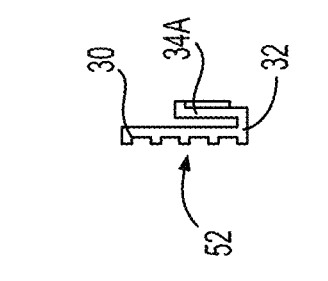
Figure 1P:
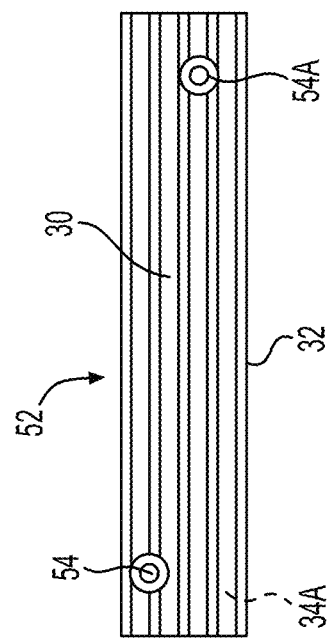
Figure 1T:
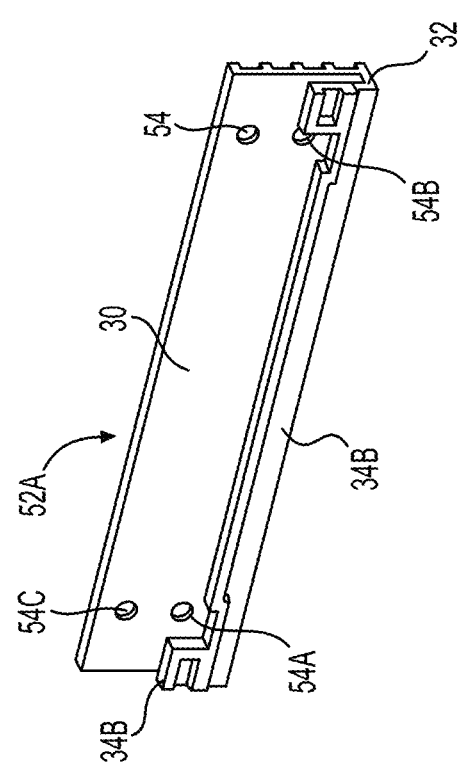
FIGS. 1S-1V are top perspective, bottom perspective, bottom, top, side, and cross-sectional side views, respectively, of a modified type-B, slide-on substrate stiffener, shown in FIGS. 1N-1R.
Figure 1S:
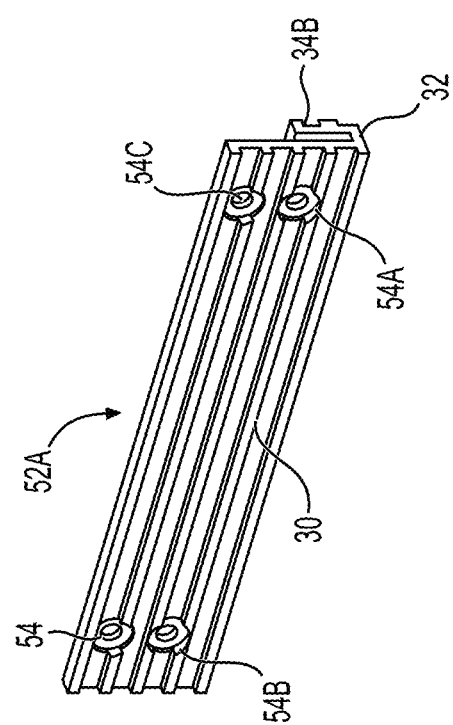
Figure 1V:
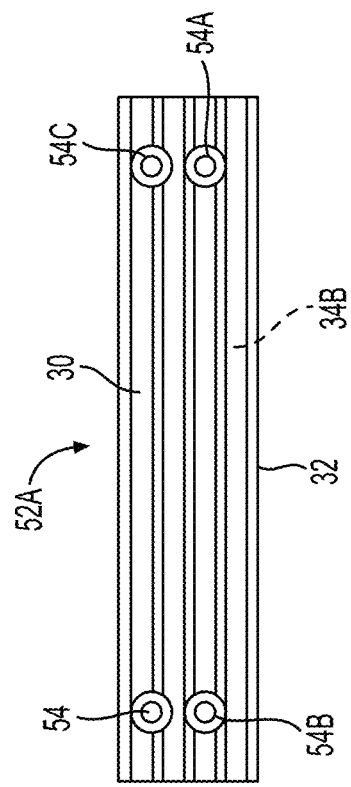
Figure 1U:
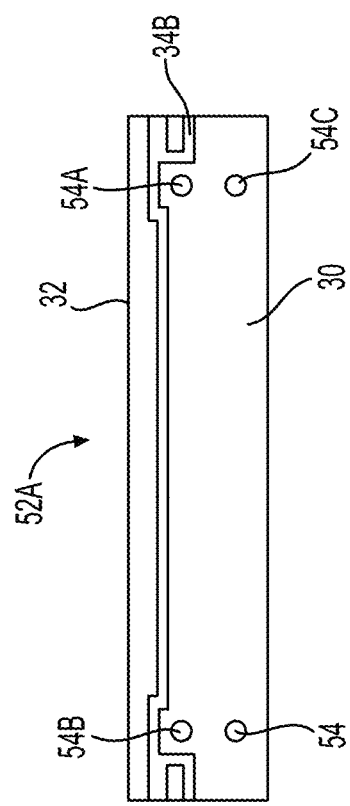

As shown in FIGS. 1G-1I, a first host substrate 16 and a second host substrate 24 can be oriented parallel or substantially parallel to one another, within manufacturing tolerances. The first host substrate 16 and the second host substrate 24 can be connected by at least one pair of mateable mezzanine connectors 18 and standoff screws 22. Any suitable mateable mezzanine connectors 18 can be used, such as those described herein. The standoff screws 22 can be used to ensure a consistent distance between the first host substrate 16 and the second host substrate 24, and to attach a slide-on substrate stiffener 26 to the first host substrate 16.

Type-A slide-on substrate stiffeners 50 are shown in various views in FIGS. 1J-1M. Each type-A slide-on substrate stiffener 50 can define a first section 30, a second section 32, and a third section 34. The first and third sections 30, 34 can be oriented parallel or generally parallel to one another within manufacturing tolerances, and the second section 32 can be oriented perpendicular or generally perpendicular to both the first and third sections 30, 34 within manufacturing tolerances. The third section 34 can be perpendicular, substantially perpendicular within manufacturing tolerances, or at an angle between about 60° to about 90°, with respect to the second section 32. The third section 34A can extend in the same direction, with respect to the second section 32, as the first section 30, and can also be perpendicular, substantially perpendicular within manufacturing tolerances, or at an angle between about 60° to about 90°, with respect to the second section 32.

One or more of the first, second, and third sections 30, 32, 34 can be devoid of holes that are configured to receive a respective board alignment feature or standoff screw. Type-A slide-on stiffeners can be configured to be friction or compression or snap or press or adhesively fit onto a substrate, such as the first host substrate 16.

Type-B slide-on substrate stiffeners 52 are shown in various views of FIGS. 1N-1R and can be structurally similar to the type-A slide-on substrate stiffeners 50. However, type-B slide-on substrate stiffeners 52 can each define a first hole 54 or a first and second hole 54, 54A (FIGS. 1N-1P and 1R). Each of the type-B slide-on substrate stiffeners 52 can include a first section 30, a second section 32 that can be perpendicular or substantially perpendicular within manufacturing tolerances to the first section 30, and a third section 34A that can be oriented parallel or substantially parallel within manufacturing tolerances to the first section 30. The third section 34A can be perpendicular, substantially perpendicular within manufacturing tolerances, or at an angle between about 60° to about 90°, with respect to the second section 32. The third section 34A can extend in the same direction, with respect to the second section 32, as the first section 30, and can also be perpendicular, substantially perpendicular within manufacturing tolerances, or at an angle between about 60° to about 90°, with respect to the second section 32.

Each of the first and second holes 54, 54A in the type-B slide-on substrate stiffener 52 can be offset, and can lie on a first line that is not parallel to the second side 32. One or both of the first and second holes 54, 54A can receive a portion of a respective standoff screw 22. Even if the standoff screws 22 are removed, the type-B slide-on substrate stiffener 52 can maintain a friction or elastic compression fit with a substrate. The third section 34A of the type-B slide-on substrate stiffener 52 can be contoured with the holes 54, 54A only provided in the first section 30. Alternatively, the third section 34A of the type-B slide-on substrate stiffener 52 can include one or two holes that correspond to the first and second holes 54, 54A in the first section 30. Stated another way, a portion of the third section 34A can extend parallel to and coincident with a portion of the first section 30, creating an overlap. Everywhere the third section 34A overlaps the first section 30, the third section 34A, the third section can be devoid of a completed circumscribed first hole 54 or second hole 54A. Alternatively, the third section 34A can include one or more holes, such as first or second holes 54, 54A that each receive a respective standoff screw 22.

FIGS. 1S-1V each show a modified type-B slide-on substrate stiffener 52A. The modified type-B slide-on substrate stiffener 52A can include a first section 30, a second section 32, and a third section 34B. The first section 30 can define one or more holes, such as a first hole 54, a second hole 54A, a third hole 54B, and a fourth hole 54C. The second section 32 can be perpendicular or substantially perpendicular within manufacturing tolerances to the first section 30. The third section 34B that can be oriented parallel or substantially parallel within manufacturing tolerances to the first section 30. The third section 34B can be perpendicular, substantially perpendicular within manufacturing tolerances, or at an angle between about 60° to about 90°, with respect to the second section 32. The third section 34B can extend in the same direction, with respect to the second section 32, as the first section 30, at an angle between about 60° to about 90°, with respect to the second section 32.

Each of the first and second holes 54, 54A in the modified type-B slide-on substrate stiffener 52A can be offset, and can lie on a first line that is not parallel to the second side 32. Third and fourth holes 54B, 54C can lie on a second line that is not parallel to the second side 32 or the first line. One or more of the first, second, third and fourth holes 54, 54A, 54B, 54C can each receive a portion of a respective standoff screw 22. Even if the standoff screws 22 are removed, the modified type-B slide-on substrate stiffener 52A can maintain a friction or elastic compression fit with a substrate. The third section 34B of the modified type-B slide-on substrate stiffener 52A can be contoured, with the first, second, third and fourth holes 54, 54A, 54B, 54B only provided in the first section 30. Alternatively, the third section 34B of the modified type-B slide-on substrate stiffener 52A can include one or more holes that each align with and correspond to a respective one of the first, second, third and fourth holes 54, 54A, 54B, 54C in the first section 30. Stated another way, a portion of the third section 34B can extend parallel to and coincident with a portion of the first section 30, creating an overlap. Everywhere the third section 34B overlaps the first section 30, the third section 34B, the third section 34B can be devoid of a completed circumscribed first hole 54 or a second hole 54A or a third hole 54B or a fourth hole 54C. Alternatively, the third section 34B can include one or more holes, such as first, second, third or fourth holes 54, 54A, 54B, 54C that each receive a respective standoff screw 22.

Board coplanarity and rigidity can be helped or maintained by the slide-on substrate stiffeners 26 discussed above. Mechanical rigidity of a connector or electrical component can be helped or maintained with a weld tab or hold down 56, such as those shown in FIGS. 2A-2E, that carries at least one pre-formed fusible element 58. A weld tab or hold down 56 an be physically attached to an electrical component or an interconnect, such as an electrical connector that can have SMT mounting ends with pre-formed fusible elements 58 or compression mounting ends.

Figure 2A:
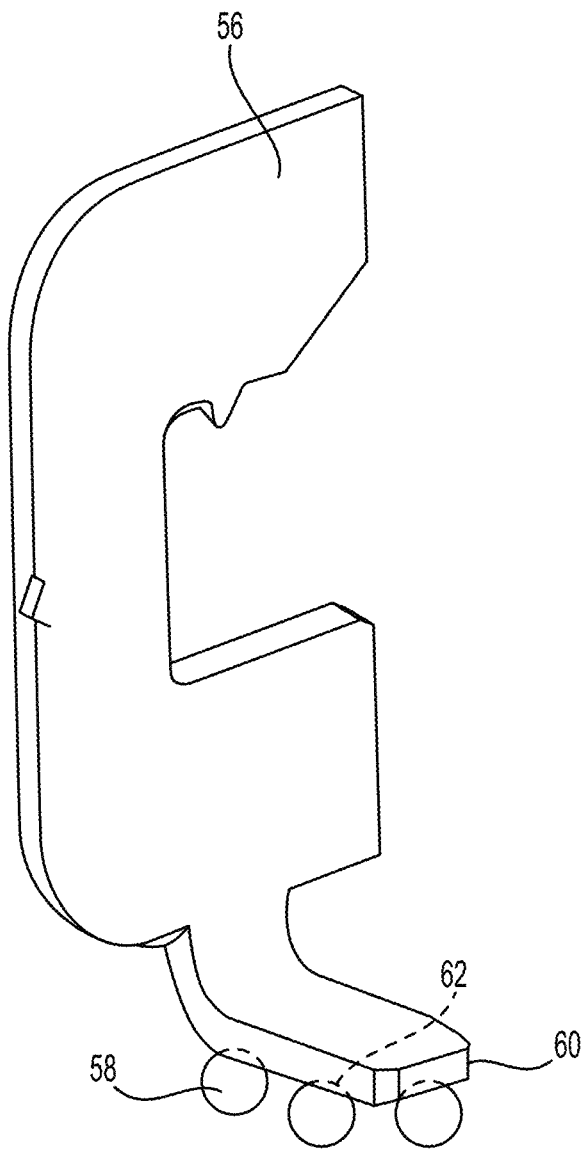
FIG. 2A shows a hold down with solder units.

FIG. 2A shows a weld tab or hold down 56 that can carry at least one, at least two, at least three, at least four, at least five, or at least six pre-formed solder slugs, solder points, solder charges, solder crimps, solder balls, and/or solder units, which are referred to herein, individually or collectively, as fusible elements 58. A hold down base 60 can define none, at least one, at least two, at least three, at least four, at least five, or at least six dimples 62, recesses, or holes that can each receive a corresponding one of the fusible elements 62. The hold down 56 fusible elements 58 can be configured to be reflowed onto substrate, for example, third host substrate 72 in FIG. 3, and can self-center, at the same time as an associated or attached interconnect, electrical connector, or component (not shown) is reflowed onto the substrate. That is, a hold down 56 with fusible elements 58 can be attached to any surface mount technology (SMT) connector or electrical component, and the entire electrical connector and hold down assembly can be reflowed onto a substrate at the same time or during the same reflow operation. Both the electrical connector, such as first and second connectors 14, 20 discussed above, and the hold down 56 can simultaneously carry respective fusible elements 58. An electrical connector is not limited to a mezzanine connector, and can be a co-planar and right-angled connector.

Fusible elements 58 disclosed herein can be pre-reflowed onto the hold down 56 or hold down base 60, adhered to the hold down 56 or hold down base 60, mechanically attached to the hold down 56 or hold down base 60 by a crimping operation, a coining operation, a pressing operation, a swaging operation, adhesive, and the like. A size or width of the fusible elements 58 disclosed herein can be reduced to fit more, smaller fusible elements 58 onto the hold down 56 or can be increased to fit fewer, larger fusible elements 58 onto the hold down 56 or the hold down base 60. Larger sized fusible elements 58, as compared to fusible elements 58 carried by a hold down 56 or an associated interconnect, electrical connector, or component can also act as a standoff of the associated interconnect, electrical connector, or component. The fusible elements 58 can also be doped with other metals, additives, or impurities such as gold, so that the fusible elements 58 carried by the hold down 56 or hold down base 60 can melt slightly before or after, in time, solder balls on the associated interconnect, electrical connector, or component melt, but during the same reflow operation. Fusible elements 58 can be lead free. The fusible elements may be shaped by a laser, which provides a carbon residue on a surface of the fusible elements that helps the fusible elements retain their shape during the reflow operation.

Figure 2B:
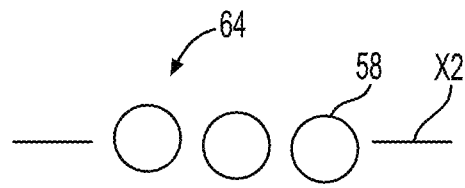
FIG. 2B shows a first solder unit pattern.
Figure 2C:
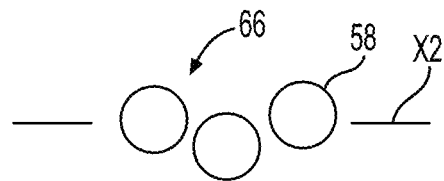
FIG. 2C shows a second solder unit pattern.
Figure 2D:
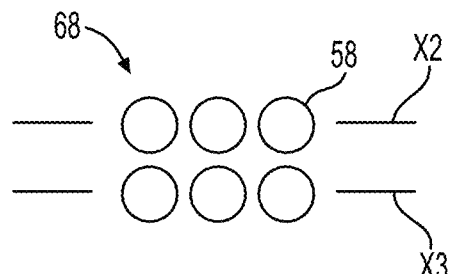
FIG. 2D shows a third solder unit pattern.
Figure 2E:
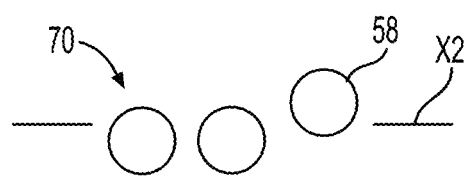
FIG. 2E shows a fourth solder unit pattern.

FIG. 2B shows a first pattern 64 of fusible elements 58 that can be attached to the hold down 56 of FIG. 2A. The first pattern 64 of fusible elements 58 can extend along an axis X2, i.e., a first axis in FIG. 2B, and can all be symmetrical about the axis X2. FIG. 2C shows a second pattern 66 of fusible elements 58 that can extend along the axis X2, i.e., a first axis in FIG. 2C. At least one of the fusible elements 58 can be positioned asymmetrically about the axis X2, and at least two of the fusible elements 58 can be positioned symmetrically about the axis X2. FIG. 2D shows a third pattern 68 of fusible elements 58, divided into a first group of fusible elements 58 that can extend along the axis X2, i.e., a first axis in FIG. 2D, and a second group of fusible elements 58 that can extend along an axis X3, i.e., a second axis in FIG. 2D. In this embodiment, the axis X2 can extend parallel to the axis X3. The fusible elements 58 can each be smaller in an external dimension as compared to any one of the fusible elements 58 shown in FIGS. 2B and 2C. At least one, at least two, or at least three of the fusible elements 58 can be positioned symmetrically with respect to the axis X2 and at least one, at least two, or at least three of the fusible elements 58 can be positioned symmetrically with respect to the axis X3. FIG. 2E shows a fourth pattern 70 of fusible elements 58 that can extend along the second axis X2, i.e., a first axis in FIG. 2E. In this embodiment, all of the fusible elements 58 are positioned asymmetrically with respect to the second axis X2.

Figure 3:
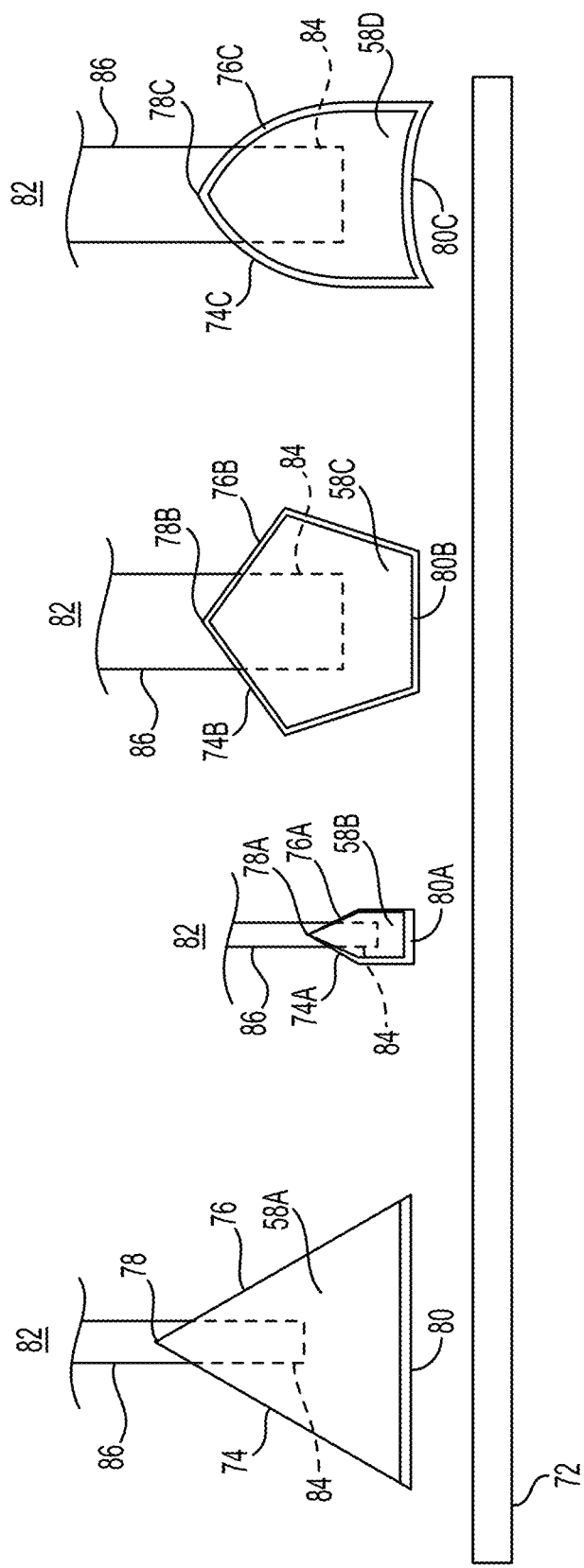
FIG. 3 is a side view of various fusible elements attached to respective mounting ends of electrical conductors.

A method can include a step of attaching a fusible element 58 to a hold down 56 or a hold down base 60 of the hold down 56 prior to reflow of the fusible element 58 onto a substrate, for example, the third host substrate 72 in FIG. 3. Another step can include sizing individual fusible elements 58 to significantly increase a total or cumulative mass of solder carried by the hold down 56 or the hold down base 60 of the hold down 56. Another step can include attaching fusible elements 58 to a hold down 56 or a hold down base 60. Another step can include positioning individual fusible elements 58 on a hold down 56 or hold down base 60 to significantly increase a total or cumulative solder mass carried by the hold down 50 or hold down base 60. The fusible elements 58 can be reflowed onto a substrate, for example, the third host substrate 72 in FIG. 3, during the same or a single reflow operation. Another step can include fitting both an electrical connector and a hold down 56 carried by the electrical connector with fusible elements 58, prior to reflow of the electrical connector, the hold down 56, and the fusible elements 58 onto a substrate, for example, the third host substrate 72 in FIG. 3.

As shown in FIG. 3, fusible elements 58A, 58B, 58C, 58D can each define a shape, in cross-section or in 3-D, prior to reflow onto a substrate, that is not a sphere, ellipsoid, cylinder, circle, ellipse, square or rectangle. Cross-sectional shapes of the reflowed fusible elements 58A, 58B, 58C, 58D include, for example, a cone, a triangle, an equilateral triangle, an isosceles triangle, an obtuse triangle, an acute triangle, a trapezoid, an acute trapezoid, an irregular quadrilateral, a concave hexagon that includes at least one reflex angle greater than 180°, an irregular hexagon that includes sides that are not equal in length and that includes one side that forms two intersecting line segments, a pentagon, a heptagon, an irregular octagon, a triangular prism, a triangular-based pyramid, tetrahedron, a square-based pyramid, a hexagonal pyramid shape, and a shape similar to the "OR" logic symbol.

Fusible elements 58A, 58B, 58C, 58D can be reflowed or formed or fused onto a respective mounting end 84 of an electrical conductor 86, with the mounting end 84 penetrating through a nadir 78, 78A, 78B, 78C of the respective fusible element 58A, 58B, 58C, 58D and extending into a body of each respective fusible elements 58A, 58B, 58C, 58D. Stated another way, each fusible element 58A, 58B, 58C, 58D is positioned only on one side or surface of a mounting end 84 of an electrical conductor 86, on only two sides or surfaces of a mounting end 84 of an electrical conductor 86, on only three sides or surfaces of a mounting end 84 of an electrical conductor 86, or on at least four sides or surfaces of a mounting end 84 of an electrical conductor 86. In general, each respective fusible element 58A, 58B, 58C, 58D is impaled through a respective apex by a respective mounting end 84, into a body of the respective fusible element 58A, 58B, 58C, 58D.

In general, the shape of each fusible element 58A, 58B, 58C, 58D can be defined by respective first solder surfaces 74, 74A, 74B, 74C and second solder surfaces 76, 76A, 76B, 76C that each converge at a respective apex 78, 78A, 78B, 78C and diverge at a respective nadir 80, 80A, 80B, 80C, where the apex 78, 78A, 78B, 78C is positioned in, on, or adjacent to a third housing 82, for example, an electrically non-conductive electrical connector housing. Each respective nadir 80, 80A, 80B, 80C can be positioned adjacent to the third host substrate 72 or corresponding pads carried by the third host substrate 72. That is, each fusible element 58A, 58B, 58C, 58D can be narrower in width at the top, near the respective apex 78, 78A, 78B, 78C, than at the bottom near the respective nadir 80, 80A, 80B, 80C, defining a shape that points toward an electrically insulative third housing 82 of an electrical connector or component. Each respective apex 78, 78A, 78B, 78C can be positioned closer in distance to the third housing 82 than the corresponding nadir 80, 80A, 80B, 80C, and can be spaced farther from the third substrate 72 or pads of the third host substrate 72 than the corresponding, respective nadir 80, 80A, 80B, 80C. The narrowest width portion of the fusible elements 58A, 58B, 58C, 58D, which can be defined as a width across the respective fusible elements 58A, 58B, 58C, 58D, measured parallel to a bottom of the third housing 82, can be attached to a solder tail or mounting end 84 of an electrical conductor 86. Each fusible element 58A, 58B, 58C, 58D can be wider at the respective nadir 80, 80A, 80B, 80C or bottom surface of the respective fusible element 58A, 58B, 58C, 58D that is farthest in distance from the third housing 82. Each respective first solder surface 74, 74A, 74B, 74C and each corresponding, respective second solder surface 76, 76A, 76B, 76C can intersect at a corresponding apex 78, 78A, 78B, 78C and diverge at each corresponding, respective nadir 80, 80A, 80B, 80C. The first surfaces 74, 74A, 74B, 74C and second solder surfaces 76, 76A, 76B, 76C can both be linear, can both curve, or one surface can be linear and the other surface can curve.

Without being bound by theory, it is believed that when fusible elements 58A, 58B, 58C, 58D with narrower apexes 78, 78A, 78B, 78C and wider nadirs 80, 80A, 80B, 80C are reflowed onto a third host substrate 72, the resulting solder joint is mechanically stronger that if using fusible elements that define a cross-sectional shape selected from a sphere, an ellipsoid, a cylinder, a circle, an ellipse, a square or a rectangle. When fusible elements 58A, 58B, 58C, 58D are reflowed or re-reflowed to attach an electrical component to the third substrate 72, unwanted mechanical or thermal stress fractures between the fusible elements 58A, 58B, 58C, 58D and the substrate, such as the third substrate 72 or pads on the third substrate 72, are reduced.

In another embodiment, a method of making a stronger solder connection can include a step of reflowing or fusing a fusible element 58A, 58B, 58C, 58D onto a respective mounting end 84 of an electrical conductor 86, wherein the reflowed or fused fusible element 58A, 58B, 58C, 58D has or defines a first external or cross-sectional shape. Another step can include subsequently sculpting the fusible element 58A, 58B, 58C, 58D to form or define a second external or cross-sectional shape that is different than the first external or cross-sectional shape. Another step can include adding a non-wetting additive to one or more surfaces of the fusible element 58A, 58B, 58C, 58D after the fusible element 58A, 58B, 58C, 58D is sculpted. Another step can include, after the step of sculpting or after the step of adding a non-wetting agent, reflowing the fusible element 58A, 58B, 58C, 58D with the second external or cross-sectional shape onto a substrate.

Fusible elements 58A, 58B, 58C, 58D can each define any geometrical shape, such as a general spherical shape after being reflowed or fused onto a respective mounting end 84 of an electrical conductor 86. At least one or more of the fusible elements 58A, 58B, 58C, 58D can have a hardness or metallurgy equal to the hardness of a pre-lasered or standard solder ball, both prior to being reflowed or fused onto a respective mounting end 84 and after being reflowed or fused onto a respective mounting end 84. After being reflowed or fused onto a corresponding respective mounting end 84, at least one of the fusible elements 58A, 58B, 58C, 58D can be sculpted, such as manually, thermally, or with a laser beam to create any geometrical, external or cross-sectional shape other than a sphere with a constant radius. Non-restrictive, exemplary shapes can include, in cross-section or in 3-D, prior to reflow onto a substrate, an ellipsoid, a cylinder, an ellipse, a square, a rectangle, a cone, a triangle, an equilateral triangle, an isosceles triangle, an obtuse triangle, an acute triangle, a trapezoid, an acute trapezoid, an irregular quadrilateral, a concave hexagon that includes at least one reflex angle greater than 180°, an irregular hexagon that includes sides that are not equal in length and that includes one side that forms two intersecting line segments, a pentagon, a heptagon, an irregular octagon, a triangular prism, a triangular-based pyramid, tetrahedron, a square-based pyramid, a hexagonal pyramid shape, and a shape similar to the "OR" logic symbol.

One or more surfaces of the fusible element 58A, 58B, 58C, 58D can be coated with a non-wetting agent, such as solder masking ink, before or after sculpting or laser sculpting, to help prohibit the wetting of select surfaces and help maintain the post-sculptured shape of the fusible element 58A, 58B, 58C, 58D through and after reflow of the fusible element 58A, 58B, 58C, 58D onto a substrate.

Heat Management

Unwanted heat and differing coefficients of thermal expansion (CTEs) between components and a PCB can cause unwanted mechanical stress and solder joint failure. When components are attached to a substrate with fixed solder joints, and the components and the substrate expand at different rates because of differing CTEs, the fixed solder joints can be stressed. Unwanted heat can also cause components or interconnects to fail or have a reduced useful life. So, controlling unwanted heat has advantages.

Figure 4:
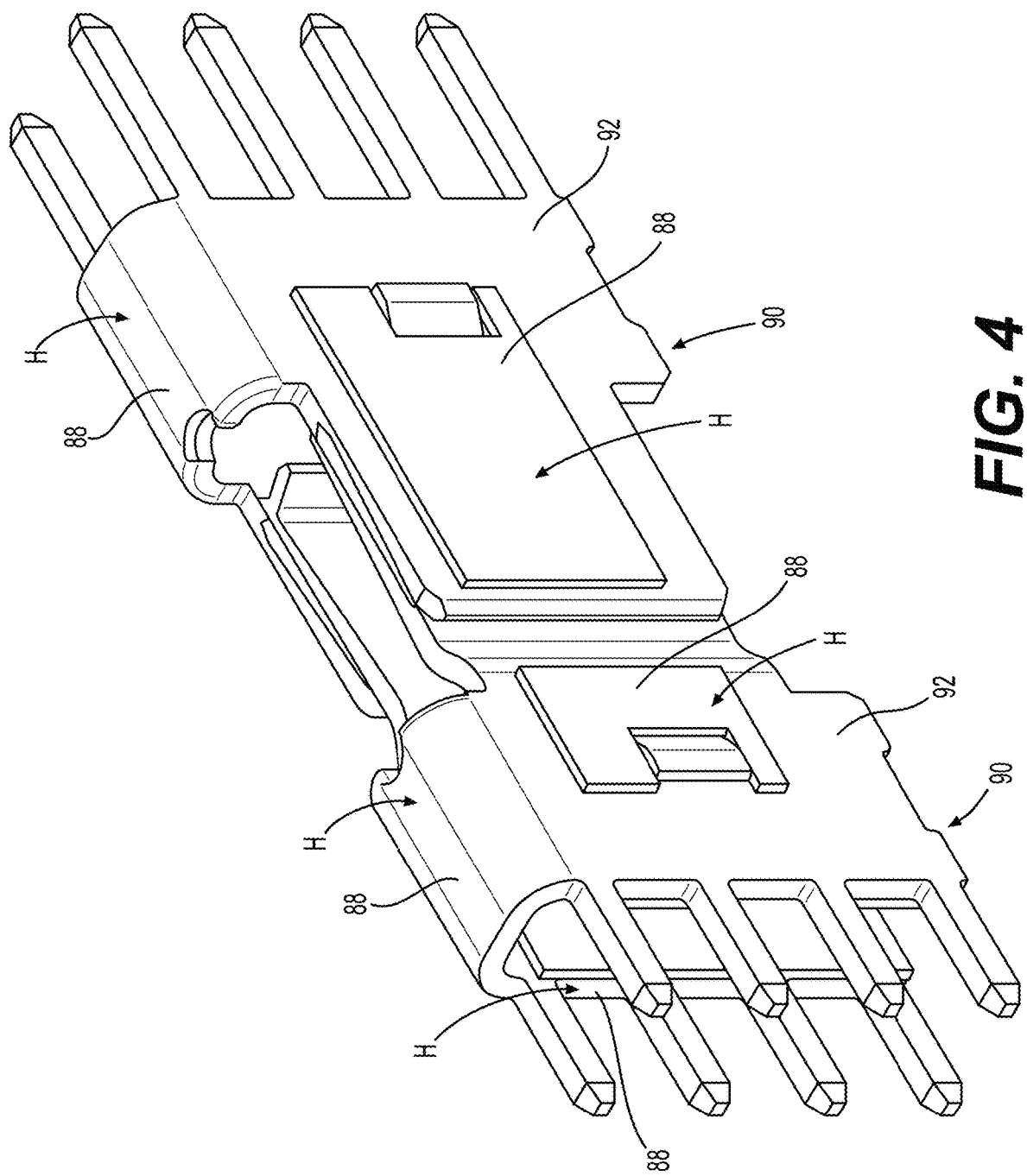
FIG. 4 is a perspective top view of mating electrical conductors, for example, power conductors.
Figure 5:
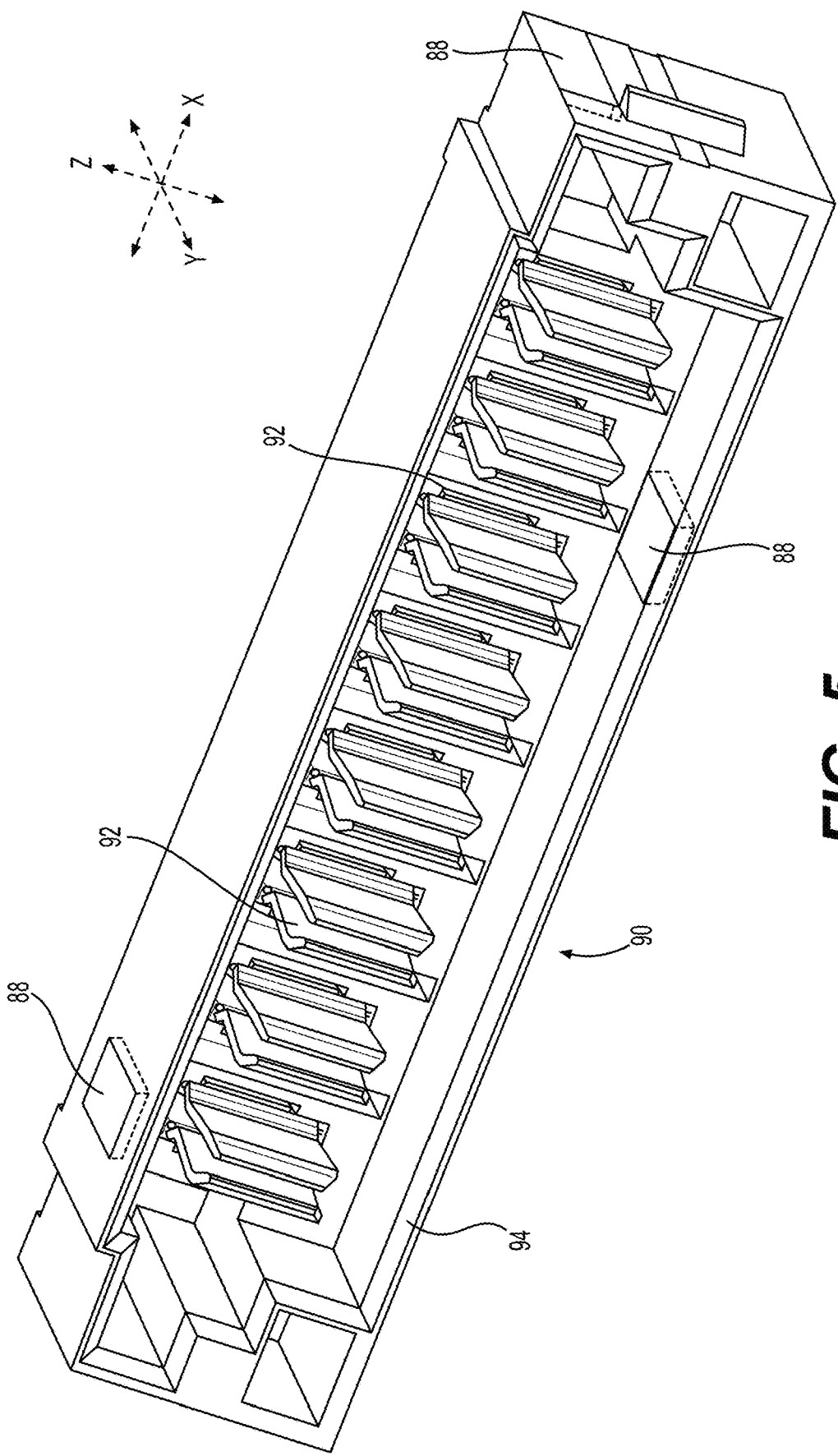
FIG. 5 is a perspective front view of heat-producing article, such as a power connector.

As shown in FIGS. 4 and 5, heat-dissipation material 88, for example, graphene or nanomaterial strips, layers, sheets, or coatings can be selectively placed on, or immediately adjacent to, heat-producing structures or articles 90, such as transceivers, electrical connectors, power conductors, optical engines, etc. Power contacts 92 are shown, but other heat-producing components, including, for example, VCSELs, optical engines, and the like, can be used. Nanomaterials can include any material that includes nanoparticles. Heat-dissipation material such as graphene, nanomaterials or both can also be added to slide-on substrate stiffeners and hold downs disclosed above, or the clips described below.

A heat-producing article 90, such as an electrical connector that produces unwanted heat, can include heat-dissipation material 88, an electrical conductor such as a power contact 92, and a dielectric or electively conductive housing, such as housing 94. The heat-dissipation material 88, such as graphene or nanomaterials, can be selectively placed such that unwanted heat is directed in a pre-determined direction away from the heat-producing article 90. Selective placement can include not positioning or coating on substantially an entire top, bottom, side, or end of a heat-producing article 90. Selective placement can include positioning multiple, at least two, at least three, at least four, at least five, or five or more discrete segments of heat-dissipation material 88 that are each separated by regions that are devoid of heat-dissipation material 88. Selective placement can include positioning heat-dissipation material 88 such that a single line cannot be drawn between three or more discrete or distinct segments or discrete or distinct areas of heat-dissipation material 88. Selective placement can include positioning discrete segments, portions, or areas of heat-dissipation material 88 non-sequentially along an axis or line. Selective placement can include positioning discrete segments, portions, or areas of heat-dissipation material 88 so that the discrete segments, portions, or areas are not immediately adjacent to one another along an axis or line. Selective placement can include positioning discrete segments, portions, or areas of heat-dissipation material 88 so that the segments, portions, or areas do not physically touch one another along an axis or line. These techniques may be used singly or in combination.

A method to dissipate heat can include a step of placing a heat-dissipation material 88 on a heat-producing article 90 to dissipate heat H away from the heat-producing article 90. Another step can include thermally evaluating a heat-producing article 90 to determine where unwanted heat H is being generated. Another step can include selectively positioning a heat-dissipation material 88, for example, graphene or a nanomaterial, only where unwanted heat is being generated by the heat-producing article 90. Another step can include selectively directing heat H away from where unwanted heat H is being produced, generated, or observed by thermal detection equipment in a heat-producing article 90 through the use of a heat-dissipation material 88 to a predetermined point in space, to predetermined points in space, to where heat H can be better tolerated or removed. A heat-dissipation material 88, for example, graphene or nanomaterial, can be applied to a heat-producing article 90 to direct the heat H to a predetermined point in space, where it can then be removed by conduction, convection, forced fluid, cooling fluid, and the like.

As shown in FIG. 5, another step can include selectively positioning all of the heat-dissipation material 88, for example, graphene or nanomaterial, asymmetrically about an X-axis and a Y-axis of a heat-producing article 90, for example, power contacts 92 and a housing 94. Another step can include positioning all of the heat-dissipation material 88, for example, graphene or nanomaterial, asymmetrically about an X-axis and a Z-axis of the heat-producing article 90, for example, power contacts 92 and the housing 94. Another step can include positioning all of the heat-dissipation material 88, for example, graphene or nanomaterial, asymmetrically about a Y-axis and a Z-axis of the heat-producing article 90, for example, power contacts 92 and a housing 94. Another step can include selectively positioning all of the heat-dissipation material 88, for example, graphene or nanomaterial, asymmetrically about each of the X-, Y-, and Z-axes of a heat-producing article 90, for example, power contacts 92 and a housing 94. The housing 94 can include glass-reinforced nylon, plastic, and the like. Graphene or nanomaterials can be attached to a metal, an electrically non-conductive material or housing, a plastic, a housing, or any combination thereof. The heat-dissipation material 88 can be arranged on an electrically non-conductive housing 94 or on power contacts 92 carried by the housing 94 such that at least on portion or section of the heat-dissipation material 88 is not positioned sequentially with respect to an immediately adjacent portion or section of the heat-dissipation material 88 or does not physically touch an immediately adjacent portion or section of the heat-dissipation material 88. The heat-dissipation material 88 can also have different sizes or shapes, or can be non-identical or visually different than another heat-dissipation material carried by a common connector or article 90 or a common housing 94. The heat-dissipation material 88 can be positioned on more than one end or side of the housing 94 or power contact 92.

Another step can include selectively positioning all of the heat-dissipation material 88, for example, graphene or nanomaterial, symmetrically about an X-axis and a Y-axis of a heat-producing article 90, for example, power contacts 92 and a housing 94. Another step can include positioning all of the heat-dissipation material 88, for example, graphene or nanomaterial, symmetrically about an X-axis and a Z-axis of the heat-producing article 90, for example, power contacts 92 and a housing 94. Another step can include positioning all of the heat-dissipation material 88, for example, graphene or nanomaterial, symmetrically about a Y-axis and a Z-axis of the heat-producing article 90, for example, power contacts 92 and a housing 94. Another step can include selectively positioning all of the heat-dissipation material 88, for example, graphene or nanomaterial, symmetrically about all of X-, Y-, and Z-axes of a heat-producing article 90, for example, power contacts 92 and a housing 94. Graphene or nanomaterials can be attached to a metal, an electrically non-conductive material or housing, a plastic, a housing, or any combination thereof.

Another step can include selectively positioning all of the heat-dissipation material 88, for example, graphene or nanomaterial, asymmetrically about the X-axis of the heat-producing article 90, for example, power contacts 92 and a housing 94. Another step can include selectively positioning all of the heat-dissipation material 88, for example, graphene or nanomaterial, asymmetrically about the Y-axis of the heat-producing article 90, for example, power contacts 92 and a housing 94. Another step can include selectively positioning all of the heat-dissipation material 88, for example, graphene or nanomaterial, asymmetrically about the Z-axis of the heat-producing article 90, for example, power contacts 92 and a housing 94. Graphene or nanomaterials can be attached to a metal, an electrically non-conductive material or housing, a plastic, a housing, or any combination thereof.

Another step can include selectively positioning all of the heat-dissipation material 88, for example, graphene or nanomaterial, symmetrically about the X-axis of the heat-producing article 90, for example, power contacts 92 and a housing 94. Another step can include selectively positioning all of the heat-dissipation material 88, for example, graphene or nanomaterial, symmetrically about the Y-axis of heat-producing article 90, for example, power contacts 92 and a housing 94. Another step can include selectively positioning all of the heat-dissipation material 88, for example, graphene or nanomaterial, symmetrically about the Z-axis of the heat-producing article 90, for example, power contacts 92 and a housing 94. Graphene or nanomaterials can be attached to a metal, an electrically non-conductive material or housing, a plastic, a housing, or any combination thereof.

Figure 6:
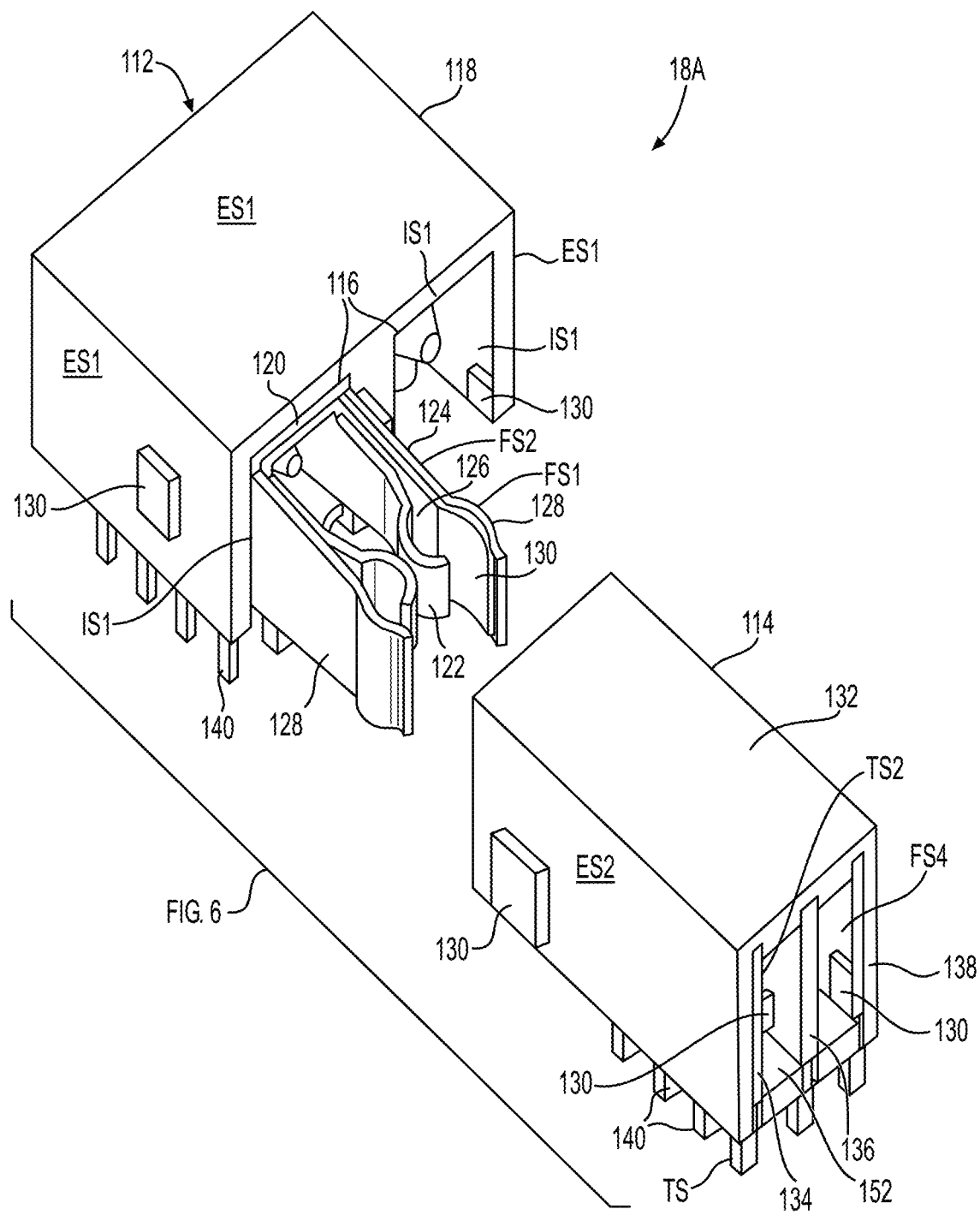
FIG. 6 is a top perspective view of mateable electrical connectors configured with graphene or nanomaterial.

As shown in FIG. 6, mateable, right-angle electrical connectors 18A can include a first electrical connector 112, for example, a receptacle electrical power connector, and a second electrical connector 114, for example, a plug electrical power connector. FIG. 6 shows examples of mateable, right-angle electrical connectors, but any suitable connectors can be used, and this disclosure and any claimed inventions are not limited to any specific electrical connectors 18A shown in FIG. 6. This disclosure applies to mezzanine and coplanar connectors as well. Other high- or low-power plug and mating receptacle connectors may be implemented within the scope of the embodiments of the present invention, for example, the power connector shown in FIG. 7 and the EDGE RATE, RAZOR BEAM, Q RATE, POWERSTRIP, and MPOWER power connectors, all commercially available from SAMTEC, Inc., New Albany, IN and all hereby incorporated by reference in their entireties. Furthermore, many other types of power connector can be provided with significant thermal improvement by implementing graphene, nanomaterials, or both graphene and nanomaterials as discussed herein with respect to the embodiments of the present invention.

With continuing reference to FIG. 6, the first electrical connector 112 can include two portions 116 for two groups of power conductors 120, a housing, for example, electrically insulative housing 118, inner power conductors 122, outer power conductors 124, a spacer 126, conductor mating ends 128 and graphene or nanomaterials 130. Second electrical connector 114 can include a housing, for example, electrically insulative housing 132, three second electrical connector conductors 134, 136, 138, and press-fit or solder tails 140. However, the mating electrical connectors 18A are not limited to the inner power conductors 122 and the outer power conductors 124, and single power conductors may be included.

Nanomaterial 130 can be an electrically conductive or an electrically non-conductive material. The nanomaterial 139 can be the AMPASHIELD-THERMAL™ brand nano-carbon material, commercially available from CAMETICS, Ltd. A nanomaterial 130 can be positioned on one, on at least one, only on one, on two, on at least two, only on two, on three, on at least three, only on three, on four, on at least four, only on four, on five, on at least five, only on five, on six, on at least six, only on six, on seven, on at least seven, only on seven, on eight, on at least eight, only on eight, on nine, on at least nine, and only on nine, or on ten of the group that includes an external surface ES1 of the housing 118; an internal surface IS1 of the housing 118; a first surface FS1 and a second surface FS2 of the conductor mating ends 128 or other areas of the power conductors 120, the inner power conductors 122, and the outer power conductors 124; a third surface TS2 and a fourth surface FS4 of one or more of the second electrical connector conductors 134, 136, 138; on or adjacent to at least one tail surface TS of the press-fit or solder tails 140; a second external surface ES2 and a second internal surface IS2 of the housing 132; and a first host substrate or second host substrate to which the first electrical connector 112 or the second electrical connector 114 are mounted.

A method can include a step of positioning, spraying, transferring, or applying a nanomaterial on one, on at least one, only on one, on two, on at least two, only on two, on three, on at least three, only on three, on four, on at least four, only on four, on five, on at least five, only on five, on six, on at least six, only on six, on seven, on at least seven, only on seven, on eight, on at least eight, only on eight, on nine, on at least nine, and only on nine, or on ten of the group that includes: an external surface ES1 of the housing 118; an internal surface IS1 of the housing 118; a first surface FS1 and a second surface FS2 of the conductor mating ends 128 or other areas of the power conductors 120, the inner power conductors 122, and the outer power conductors 124; a third surface TS2 and a fourth surface FS4 of one or more of the second electrical connector conductors 134, 136, 138; on or adjacent to at least one tail surface TS of the press-fit or solder tails 140; a second external surface ES2 and a second internal surface IS2 of the housing 132; and a first host substrate or second host substrate to which the first electrical connector 112 or the second electrical connector 114 are mounted.

Jointly or separately with respect to the nanomaterials discussed above, contact resistance and unwanted Joule heating of an electrical conductor, such as a power conductor can be reduced by placing a removable or non-removable clip on a power conductor, for example, a mating interface of a power conductor. The clip can be retrofit on existing power conductors or electrical connectors, providing more power throughput at the same temperature rise time.

Figure 7:
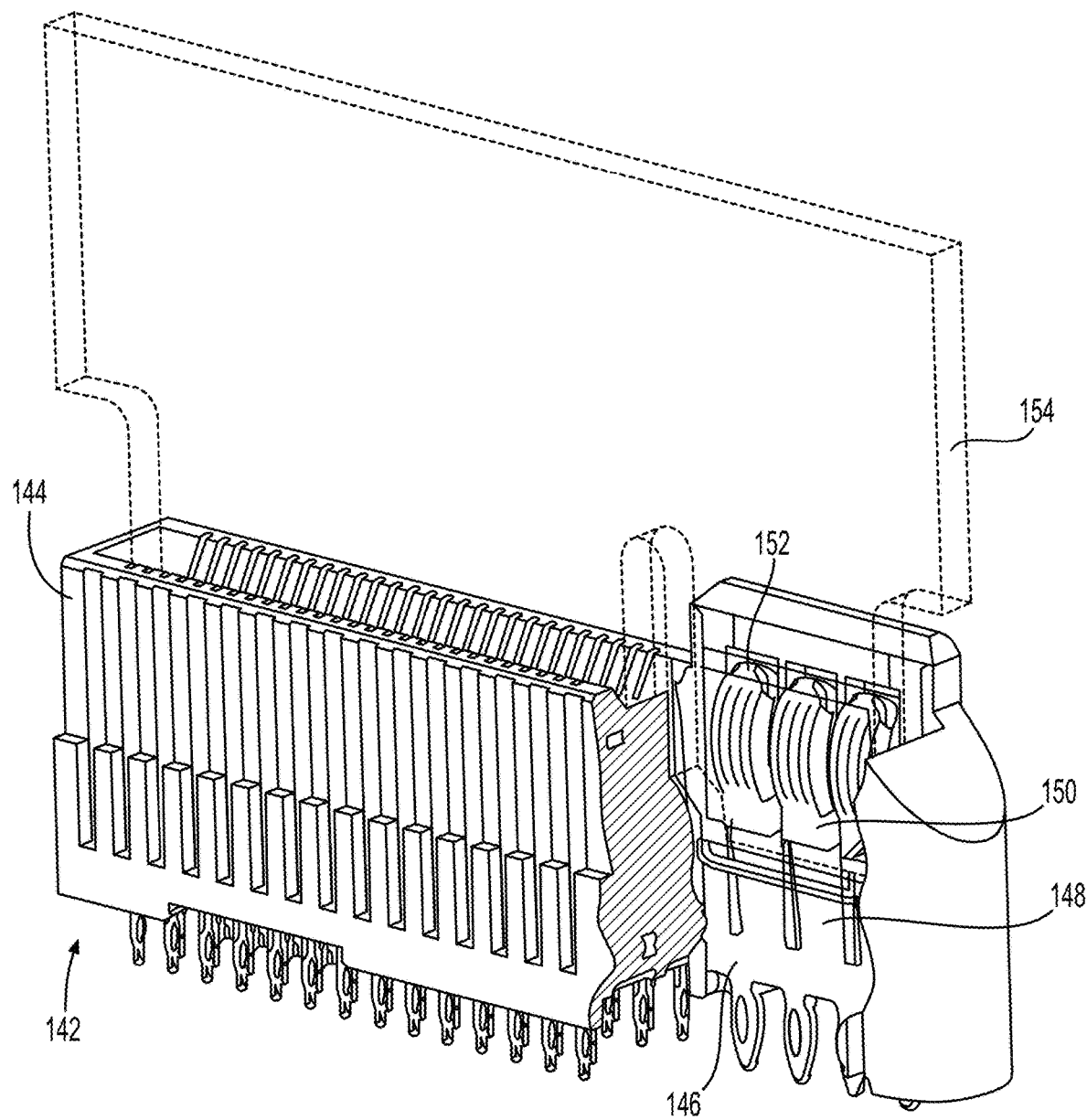
FIG. 7 is a perspective side view of a first embodiment card edge connector with power contact clips.

As shown in FIG. 7, an electrical connector, such as power connector 142 can include an electrically insulative seventh housing 144, at least one or a plurality of electrical conductors, such as power contacts 146, and at least one conductor arm 148. A cover, guard, overlay, barred frame, or clip 150, such as a removable or separable clip 150, can be added to, attached to, hung on, affixed to, or received by a mating end 152 of a respective one of the at least one respective conductor arm 148. While the mating end 152 defines an existing contact surface that engages a corresponding contact surface of a mating electrical conductor, corresponding fingers 160 of clip 150 can form at least one, at least two, at least three, or four or more new respective replacement contact surfaces that physically, electrically, or physically and electrically contact a mating electrical conductor. The replacement contact surfaces can be physically spaced from the existing contact surface. The replacement contact surfaces can each physically, electrically, or physically and electrically contact a corresponding pad of a card 154, a corresponding mating electrical conductor of a mating connector, or another clip 150 carried by a mating electrical conductor. Power contacts 146 equipped with or retrofitted with one or more respective clips 150 can be carried by a card-edge connector 166 that is able to receive an edge of a card 154. Electrical conductors such as power contacts 146 can also be carried by a co-planar connector, mezzanine connector, or right-angled connector. The clip 150 can be retrofitted to an existing electrical conductor, such as a respective signal, ground, or power contact 146, wherein a power contact 146 with the clip 150 can carry more power or current at a 30° C. rise time than the same power contact 146 without the clip 150. A signal conductor or a pair of differential signal conductors with the clip 150 can pass signals with less reflection, insertion loss, return loss, or impedance mismatch compared to a signal conductor or a pair of differential signal conductors that do not have clip 150 or respective clips 150.

Figure 8:
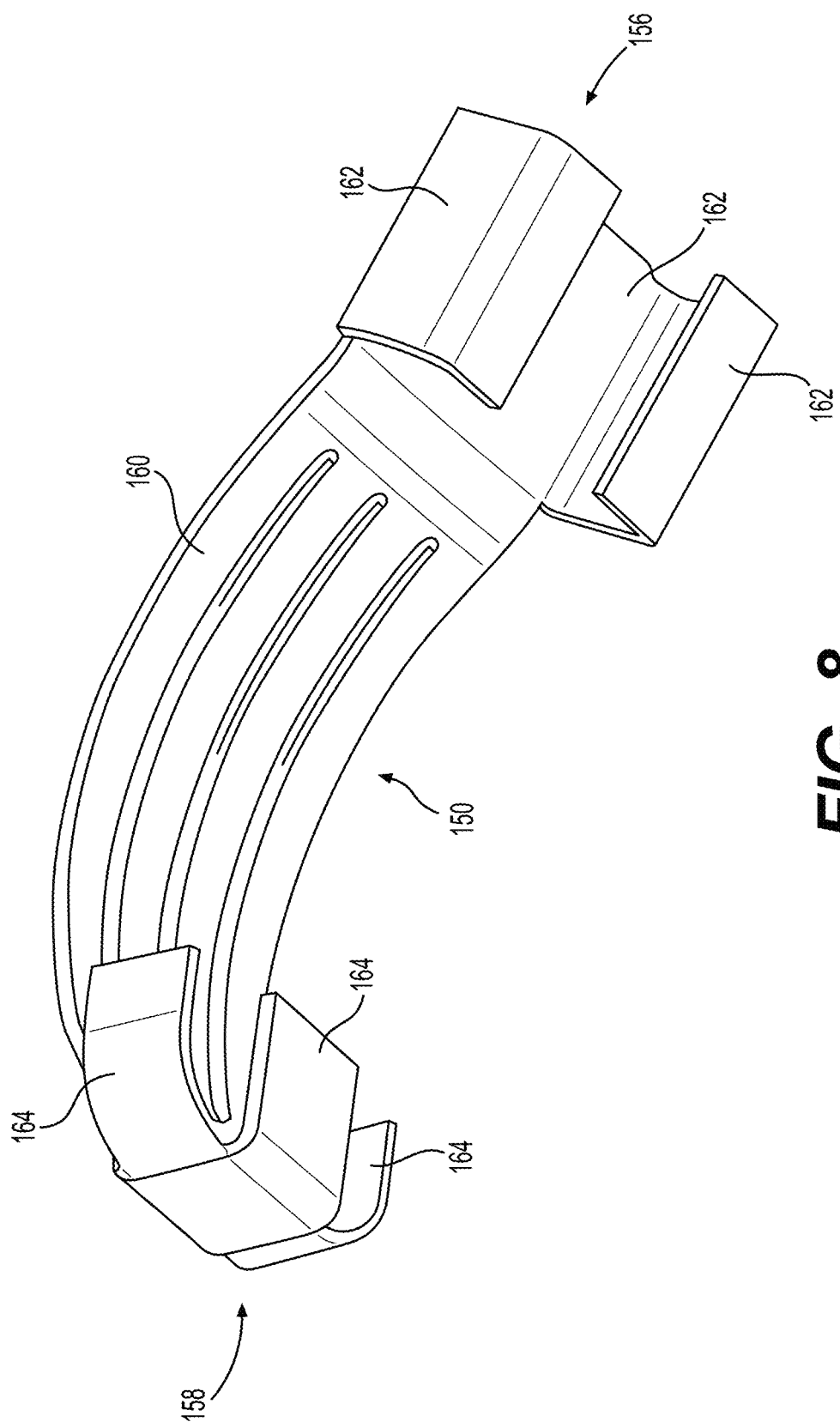
FIG. 8 is a perspective bottom view of the clip shown in FIG. 7.

FIG. 8 shows an isolated view of the clip 150. Clip 150 can be made from an electrically conductive material, such as a stamped and formed beryllium copper, an alloy, a heat absorbing material, a magnetic absorbing material, or an electrically conductive or electrically non-conductive substrate coated with an electrical conductive material. The clip 150 can include a first retention portion 156, a second retention portion 158 spaced from the first retention portion 156, and at least one, at least two, at least three or at least four rigid or compliant spring arms or fingers 160 that can each extend between the first retention portion 156 and the second retention portion 158. Each finger 160 can be attached to the clip 150 at only one end or at both opposed ends. Each finger 160 can define a curve or arc from one end of the finger 160 to the other end of the finger 160. A replacement contact surface can be defined at an apex of the curve or arc. Fingers 160 can each be spaced apart spring arms, compliant beams or a single stamping that defines a one or more parallel slits that mechanically weaken a single stamped beam, and fingers 160 can be configured to connect electrically, physically, or both electrically and physically with a single mating power conductor, a stamped mating power conductor, or a mating power conductor that also defines at least one, at least two, at least three, at least four or spring arms or fingers 160.

The first retention portion 156 can include one or more first arms or friction arms 162 that frictionally or otherwise hold the clip 150 on a corresponding mating end 152, as shown in FIG. 7, of a conductor arm 148, and one or more second arms or friction arms 164 configured to frictionally or otherwise hold the clip 150 at another portion of the corresponding mating end 152, as shown in FIG. 7, of the conductor arm 148. The clip 150 can be removable, or can be attached to a corresponding electrical conductor, such as power contact 146, via a semi-permanent or permanent attachment, such as soldering, welding, or laser welding.

The clip 150 can at least double, at least triple, at least quadruple, at least quintuple, at least sextuple, at least septuple, at least octuple, at least nonuple, at least decuple, at least undecuple, etc. the number of points of physical contact, electrical contact, or both physical and electrical contact as compared to an electrical conductor, power contact 146, or conductor arm 148 without the clip 150. Contact resistance, along with unwanted heat, can be reduced by the clip 150, which increases the number of physical or electrical contact points between two mating electrical conductors, as compared to a single beam power contact 146 without the clip 150. Each clip 150 adds more electrically conductive material to a power contact 146 or a mating end 152 of an electrical conductor or power contact 146, which also helps to reduce heat. Air can also circulate, to some degree, between the fingers 160 and the corresponding mating end 152 or existing contact surface of the conductor arms 148.

Figure 9A:
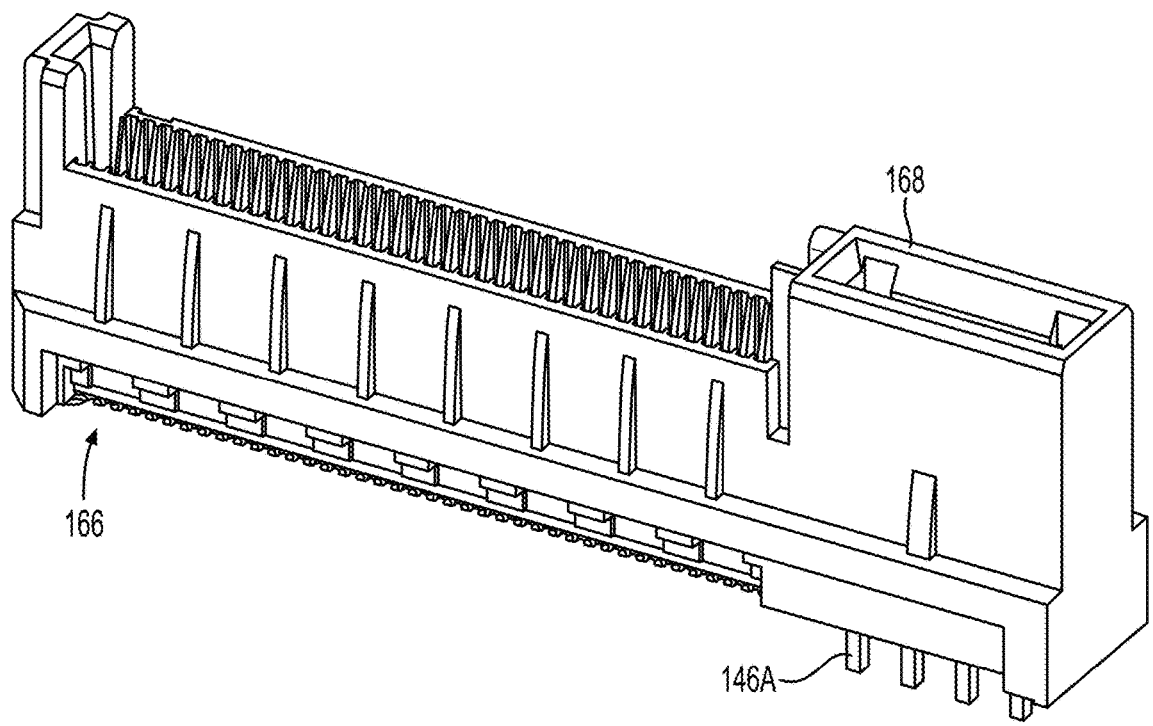
FIGS. 9A and 9B are perspective side and perspective bottom views of a second embodiment card edge connector.
Figure 9B:
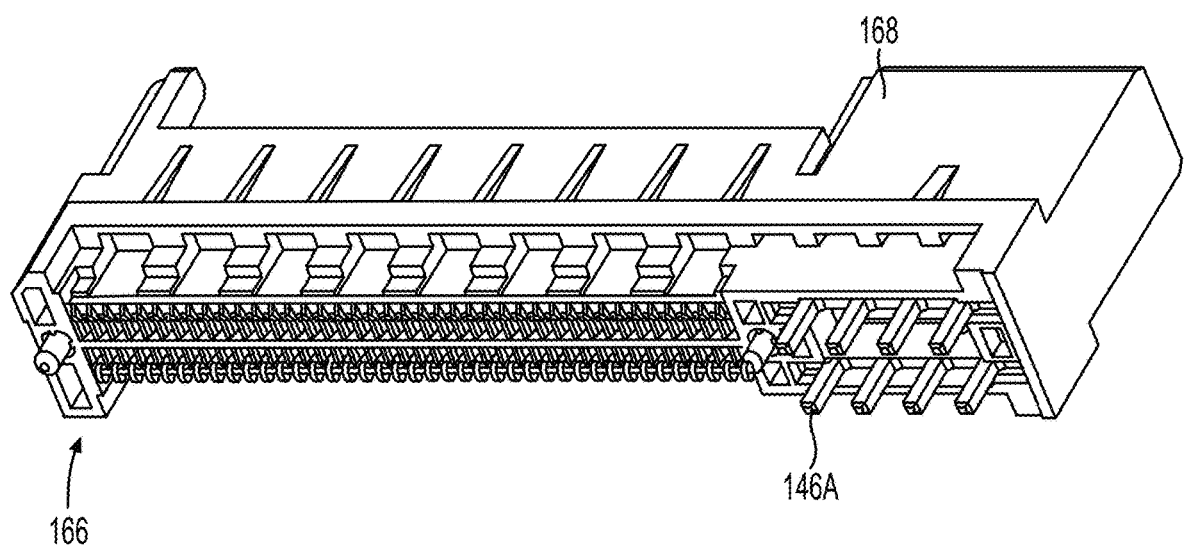

FIGS. 9A and 9B show top and bottom perspective views of a card-edge connector 166, which is a modification of the power connector 142 shown in FIG. 7. As shown in FIGS. 9A and 9B, the card-edge connector 166 can include an electrically insulative housing 168 and at least one or a plurality of power contacts 146A.

Figure 9C:
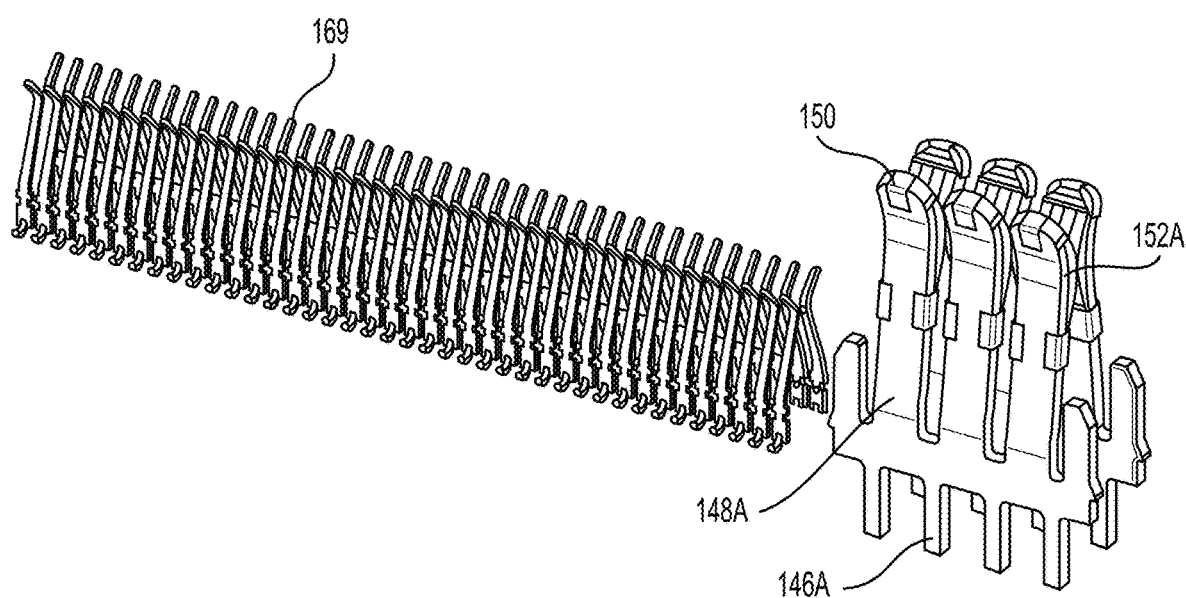
FIG. 9C is a perspective view of the second embodiment card edge connector of FIGS. 9A and 9B, with the eighth housing removed for clarity.

FIG. 9C is a perspective view of the card-edge connector 166 shown in FIGS. 9A and 9B with the housing removed. As shown in FIG. 9C, the card-edge connector 166 can further include a power contact 146A having at least one conductor arm 148A. As discussed above, a clip 150 can be added, attached, removably attached, permanently attached, or electrically attached to a mating end 152A of one or more of the at least one respective conductor arms 138A. Signal conductors 169 are also shown.

According to the above steps and features, location(s) of unwanted heat can be determined, and the unwanted heat can be selectively directed by a heat-dissipation material, for example, graphene or metamaterial. A step can include placing a heat-dissipation material non-uniformly on a heat-producing article to dissipate heat away from the heat-producing article. An electrical connector can include any three, or any four, or five of a group including a housing, an electrical conductor such as a power contact, a clip positioned on a mating end of the electrical conductor, a nanomaterial or graphene carried by the electrical connector or the housing, and a non-spherical, in cross-section and prior to reflow onto a substrate, fusible element positioned adjacent to a mounting end of the electrical conductor.

EMI Management

Figure 10A:
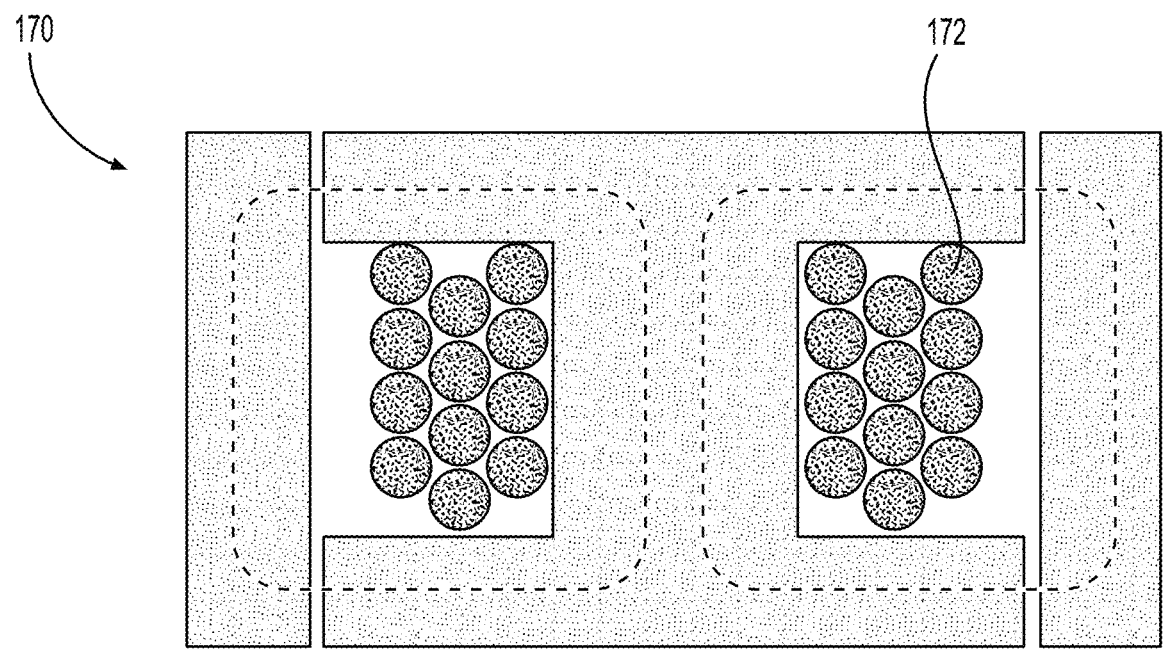
FIGS. 10A and 10B are transparent side views of a prior art inductor.
Figure 10B:
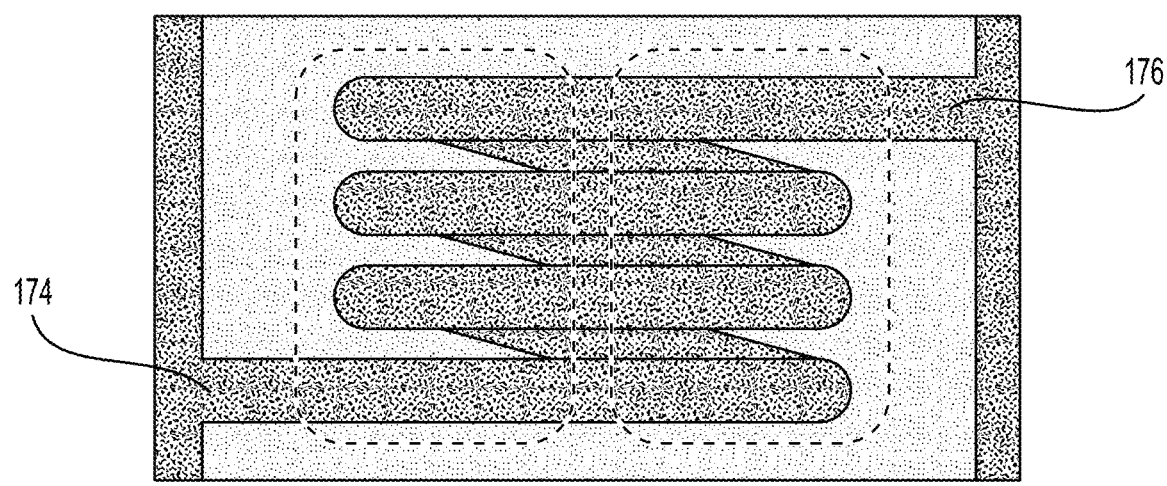
Figure 10C:
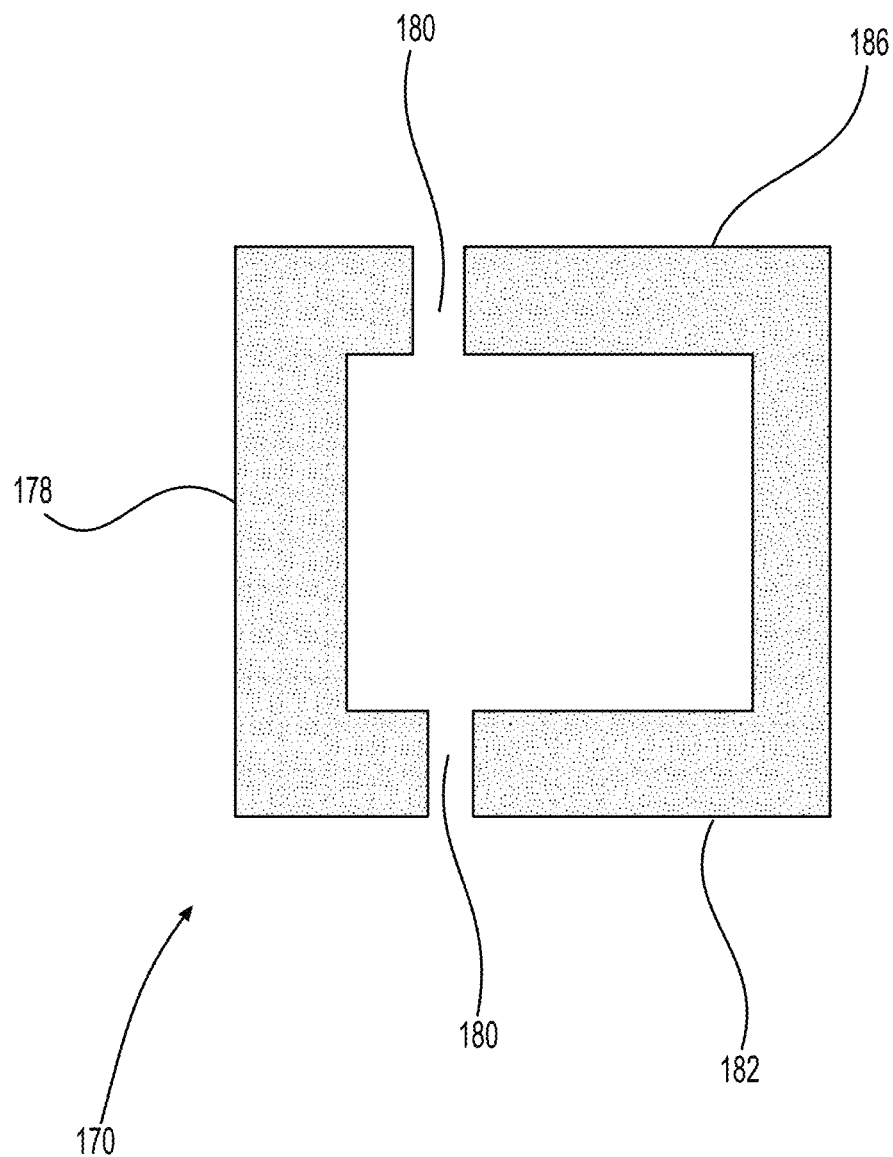
FIG. 10C is a schematic side view of the prior art inductor shown in FIGS. 10A and 10B.

FIGS. 10C and 10D show the differences between a known fully shielded inductor (for example, prior art inductor 170 of FIGS. 10A-10C) and an inductor 170A according to an embodiment of the present in invention.

Referring to FIG. 10D, other than the openings in the inductor shield 178A that are filled by the first terminal (not shown) and the second terminal (not shown), the inductor shield 178A of the inductor 170A can define only a single slit, crevice, void, recess, or separation 180A in the inductor shield 178A. The single slit, crevice, void, recess, or separation 180A in the inductor shield 178A can be defined in a first shield wall 182A that extends parallel or substantially parallel within manufacturing tolerances to a base substrate 184A and is spaced closest in distance to a mounting base substrate 184 that receives the first and second terminals. That is, the inductor shield 178A is devoid of a slit, crevice, void, recess, or separation in any other shield wall, for example, second shield wall 186A, other than shield wall 182A.

Referring to Prior Art FIGS. 10A-10C, the airgap, slit, crevice, recess, or void 180 on the top or second shield wall 186 of the fully shielded inductor 170 creates a strong, and unwanted, magnetic field above the inductor 170. This unwanted EMI can degrade the signal integrity of components within the magnetic field. Conversely, the inductor 170A shown in FIG. 10D does not include any airgap, slit, crevice, recess, or void in the second shield wall 186A, and thus unwanted EMI emissions from the inductor 170A are significantly reduced.

Comparing Prior Art FIGS. 10A-10C with FIG. 10D, a primary difference is that FIG. 10D shows a single void 180, and Prior Art FIGS. 10A-10C show a pair of voids 180. Otherwise, the inductor 170A is otherwise structurally similar to inductor 170. Inductor 170A can include a wound coil 172 as shown in FIG. 10A and an inductor shield 178A as shown in FIG. 10D. The wound coil 172 of FIG. 10A can have a first terminal 174 as shown in FIG. 10B and a second terminal 176 as shown in FIG. 10B at opposite ends of the wound coil 172 or windings as shown in FIG. 10A. The inductor shield 178A can include at least one void 180 not occupied by the first terminal 174 shown in FIG. 10B or the second terminal 176 shown in FIG. 10B, and the at least one void 180 can be positioned only beneath all of the windings of the wound coil 172 shown in FIG. 10A positioned inside the inductor shield 178A shown in FIG. 10D.

While the disclosure has been described with reference to the embodiments, it will be understood by those skilled in the art that various changes may be implemented, and equivalents may be substituted for elements thereof without departing from the scope of the disclosure. In addition, modifications may be implemented to adapt a particular system, device, or component thereof to the teachings of the disclosure without departing from the scope thereof. Therefore, it is intended that the disclosure is not limited to the embodiments described herein, but that the disclosure will include all embodiments falling within the scope of the appended claims.

The terminology used herein is for the purpose of describing the embodiments only and is not intended to be limiting of the disclosure. As used herein, the singular forms "a", "an", and "the" are intended to include the plural forms as well, unless the context clearly indicates otherwise. It will be further understood that the terms "comprises" and/or "comprising," when used in this specification, specify the presence of features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

We claim:

1. An electrical system comprising:
 a substrate;
 a first electrical connector positioned on the substrate; and
 a slide-on stiffener that wraps around an edge of the substrate and that does not contact any other substrate, wherein
 the slide-on stiffener includes:
  a first section;
  a second section that is perpendicular or substantially perpendicular to the first section; and
  a third section that is parallel or substantially parallel to the first section and is perpendicular or substantially perpendicular to the second section,
 the second section abuts or is adjacent to a corresponding edge of the substrate when the slide-on substrate stiffener is attached to the substrate,
 when the slide-on substrate stiffener is attached to the substrate, the first section extends over the first electrical connector when viewed in plan and does not physically or electrically touch the first electrical connector, and
 the slide-on substrate stiffener is toolless and does not include surface-mount technology (SMT), press-fit, or fastener mounts.

2. The electrical system of claim 1, wherein the first electrical connector includes:
 an electrically dielectric housing; and
 graphene, nanomaterial, or both graphene and nanomaterial;
 the graphene, the nanomaterial, or both the graphene and the nanomaterial are positioned asymmetrically about each of the X-, Y-, and Z-axes of the electrically dielectric housing, on the slide-on stiffener, or both the electrically dielectric housing and the slide-on stiffener.

3. The electrical system of claim 2, wherein
 the first electrical connector further includes a fusible element that defines, prior to reflow onto the substrate, an apex and a nadir,
 a width of the fusible element at the apex is narrower than a width of the fusible element at the nadir, and
 the apex is positioned closer to the electrically dielectric housing than the nadir.

4. The electrical system of claim 1, wherein
 the first electrical connector includes a hold down; and
 the hold down carries fusible elements prior to reflow of the first electrical connector onto the substrate.

5. The electrical system of claim 1, wherein the first electrical connector includes a power conductor including a removable or non-removable clip positioned on a mating interface or mating surface of the power conductor.

6. The electrical system of claim 1, further comprising an inductor positioned on the substrate, wherein
 the inductor includes only a single slit, crevice, void, recess, or separation in the inductor shield, other than where first and second terminals of the inductor exit the inductor shield.

7. The electrical system of claim 1, wherein the slide-on stiffener slides on and off the substrate in a direction perpendicular or substantially perpendicular to the edge of the substrate.

8. The electrical system of claim 1, wherein:
 the first section contacts a top surface of the substrate;
 the third section contacts a bottom surface of the substrate; wherein
 the first section is longer than the third section.

9. The electrical system of claim 1, wherein the slide-on stiffener defines at least one hole, and the at least one hole receives a fastener.

10. The electrical system of claim 1, wherein the slide-on stiffener defines at least two offset holes, and each of the at least two offset holes receives a corresponding fastener.

11. The electrical system of claim 1, wherein the slide-on stiffener includes at least one of electrically conductive material, electrically non-conductive material, or magnetic absorbing material.

12. A slide-on substrate stiffener comprising:
a first section;
a second section that is perpendicular or substantially perpendicular to the first section; and
a third section that is parallel or substantially parallel to the first section and is perpendicular or substantially perpendicular to the second section, wherein
the second section abuts or is adjacent to a corresponding edge of a first host substrate when the slide-on substrate stiffener is attached to the first host substrate
the first section, the second section, and the third section each have a first width,
the first host substrate includes a first electrical connector, and
the first width is approximately equal to a second width of a housing of the first electrical connector minus board alignment features of the housing of the first electrical connector.

13. The slide-on substrate stiffener of claim 12, wherein the first and the third sections extend in a same direction with respect to the second section.

14. The slide-on substrate stiffener of claim 12, further comprising a fourth section that extends perpendicular or substantially perpendicular to the first section and parallel or substantially parallel to the second section.

15. The slide-on substrate stiffener of claim 14, further comprising a fifth section that extends perpendicular or substantially perpendicular to the third section and parallel or substantially parallel to both the second section and the fourth section.

16. The slide-on substrate stiffener of claim 15, wherein
the fourth section is connected to a first end of the first section, and
the first section and the second section are connected at a second end of the first section opposite to the first end of the first section.

17. The slide-on substrate stiffener of claim 15, wherein
the fifth section is connected to a first end of the third section, and
the third section and the second section are connected at a second end of the third section opposite to the first end of the third section.

18. A system comprising:
the slide-on substrate stiffener of one of claim 15;
the first host substrate;
a first electrical connector positioned on the first host substrate;
a second host substrate positioned parallel or substantially parallel to the first host substrate; and
a second electrical connector positioned on the second host substrate, wherein
the first section, the second section, the third section, the fourth section, and the fifth section do not touch the first electrical connector, the second electrical connector, or the second host substrate.

19. The system of claim 18, wherein the slide-on substrate stiffener only physically touches one of the first host substrate or the second host substrate.

20. The system of claim 18, wherein the slide-on substrate stiffener is frictionally and removably attached to the first host substrate.

21. The slide-on substrate stiffener of claim 12, wherein, when the slide-on substrate stiffener is attached to the first host substrate, the first section extends over the first electrical connector when viewed in plan and does not physically or electrically touch the first electrical connector.

22. The slide-on substrate stiffener of claim 12, further comprising graphene and/or nanomaterial.

23. The slide-on substrate stiffener of claim 12, wherein in cross-section, the slide-on substrate stiffener defines a U-shape with opposed, parallel flared ends.

24. The slide-on substrate stiffener of claim 12, wherein the first section defines at least one hole, and the at least one hole receives a fastener.

25. The slide-on substrate stiffener of claim 12, wherein the slide-on substrate stiffener is toolless and does not include surface-mount technology (SMT), press-fit, or fastener mounts.

26. The slide-on substrate stiffener of claim 12, wherein the slide-on stiffener slides on and off the substrate in a direction perpendicular or substantially perpendicular to the edge of the substrate.

27. The slide-on substrate stiffener of 12, wherein:
when connected to a substrate, the first section contacts a top surface of substrate, and the third section contacts a bottom surface of substrate; and
the first section is longer than the third section.

28. The slide-on substrate stiffener of claim 12, wherein the slide-on stiffener defines at least two offset holes, and each of the at least two offset holes receives a corresponding fastener.

29. The slide-on substrate stiffener of claim 12, wherein the slide-on stiffener includes electrically conductive material, electrically non-conductive material, and/or magnetic absorbing material.

* * * * *